(12) United States Patent
Kim et al.

(10) Patent No.: US 9,716,041 B2
(45) Date of Patent: Jul. 25, 2017

(54) SEMICONDUCTOR DEVICE AND METHOD FOR FABRICATING THE SAME

(71) Applicant: SAMSUNG ELECTRONICS CO., LTD., Suwon-si, Gyeonggi-Do (KR)

(72) Inventors: Dong-Kwon Kim, Gimcheon-si (KR); Kang-Ill Seo, Chungcheongbuk-do (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 14/751,594

(22) Filed: Jun. 26, 2015

(65) Prior Publication Data

US 2016/0379886 A1    Dec. 29, 2016

(51) Int. Cl.

| | |
|---|---|
| *H01L 29/66* | (2006.01) |
| *H01L 21/8234* | (2006.01) |
| *H01L 21/3213* | (2006.01) |
| *H01L 21/311* | (2006.01) |
| *H01L 29/417* | (2006.01) |
| *H01L 21/762* | (2006.01) |

(52) U.S. Cl.
CPC ...... *H01L 21/823431* (2013.01); *H01L 21/31111* (2013.01); *H01L 21/31144* (2013.01); *H01L 21/32139* (2013.01); *H01L 21/76224* (2013.01); *H01L 21/823437* (2013.01); *H01L 21/823481* (2013.01); *H01L 29/41783* (2013.01); *H01L 29/6653* (2013.01); *H01L 29/6656* (2013.01); *H01L 29/66545* (2013.01)

(58) Field of Classification Search
CPC ....... H01L 21/823431; H01L 21/76224; H01L 21/823824
See application file for complete search history.

(56) References Cited

U.S. PATENT DOCUMENTS

| | | | |
|---|---|---|---|
| 8,377,759 B2 | 2/2013 | Cheng et al. | |
| 8,431,466 B2 * | 4/2013 | Lin ................... | H01L 21/76232 257/E21.54 |
| 8,609,499 B2 | 12/2013 | Ho et al. | |
| 8,703,556 B2 | 4/2014 | Kelly et al. | |
| 8,735,991 B2 | 5/2014 | Shieh et al. | |
| 8,822,343 B2 | 9/2014 | Hsieh et al. | |
| 8,846,490 B1 | 9/2014 | Shieh et al. | |

(Continued)

*Primary Examiner* — John C Ingham
(74) *Attorney, Agent, or Firm* — F. Chau & Associates, LLC

(57) ABSTRACT

A method for fabricating a semiconductor device includes forming a pre-fin extending in a first direction, the pre-fin including first, second, and third regions, forming first and second gates on the pre-fin to extend in a second direction intersecting the first direction, the first and second gates being spaced apart from each other in the first direction and overlapping with the first and second regions, respectively, forming first and second dummy spacers on the first and second regions, respectively to form a first trench in the third region that exposes the third region, forming a second trench by etching the exposed third region using the first and second dummy spacers as masks to separate the pre-fin into first and second active fins corresponding to the first and second regions, respectively, forming a dummy gate by filling the first and second trenches and removing the first and second dummy spacers.

18 Claims, 23 Drawing Sheets

(56) References Cited

U.S. PATENT DOCUMENTS

| | | | |
|---|---|---|---|
| 8,846,491 B1* | 9/2014 | Pham | H01L 21/76224 |
| | | | 257/E21.409 |
| 8,871,597 B2* | 10/2014 | Shieh | H01L 21/82341 |
| | | | 257/E21.409 |
| 9,324,790 B2* | 4/2016 | Akarvardar | H01L 27/0886 |
| 9,362,181 B1* | 6/2016 | Xie | H01L 21/82387 |
| 9,362,276 B2* | 6/2016 | Hong | H01L 21/308 |
| 2013/0113023 A1 | 5/2013 | Chen et al. | |
| 2014/0001572 A1 | 1/2014 | Bohr et al. | |
| 2014/0117454 A1 | 5/2014 | Liu et al. | |
| 2014/0183687 A1 | 7/2014 | Cai et al. | |
| 2014/0217505 A1 | 8/2014 | Lin | |
| 2014/0256144 A1 | 9/2014 | Lo et al. | |
| 2014/0264572 A1 | 9/2014 | Kim et al. | |
| 2014/0273464 A1 | 9/2014 | Shieh et al. | |

\* cited by examiner

SEMICONDUCTOR DEVICE AND METHOD FOR FABRICATING THE SAME

BACKGROUND

1. Technical Field

The present inventive concept relates to a semiconductor device and a method for fabricating the same.

2. Discussion of Related Art

A multi-gate transistor in which a silicon body has a fin or nanowire shape is formed on a substrate and a gate is formed on a surface of a silicon body may be used to increase the density of semiconductor devices.

Since the multi-gate transistor uses a three-dimensional channel, scaling is more easily achieved. Also, it is possible to improve the current controllability without increasing the gate length of the multi-gate transistor. In addition, it is possible to effectively suppress a short channel effect (SCE) in which the potential of a channel region is affected by a drain voltage.

A shallow trench isolation (STI) process may be performed to isolate a space between adjacent transistors that do not share a source or drain by using an insulator. With the introduction of a fin technique, a fin cut process for the isolation has been introduced. In this case, if the critical dimension (CD) of the cut fin in the STI is smaller than the critical dimension of the gate, both ends of the fin of the transistor are tucked below one gate, and it is possible to implement a single diffusion break.

A single diffusion break can be implemented by performing the fin cut process after fin mask patterning or after forming the fin. However, in a process for further improving the integration, since an alignment margin between the cut fin and the gate is further reduced, and it is difficult for both ends of the cut fin to be tucked in one gate.

SUMMARY

A method for fabricating a semiconductor device with a reduced cell size is provided according to an example embodiment of the inventive concept.

According to an example embodiment of the present inventive concept, there is provided a method for fabricating a semiconductor device. The method includes forming a pre-fin extending in a first direction, the pre-fin including a first region, a second region and a third region separating the first region from the second region, forming first and second gates on the pre-fin to extend in a second direction intersecting the first direction, the first and second gates being spaced apart from each other in the first direction and overlapping with the first and second regions, respectively, forming first and second dummy spacers on the first and second regions, respectively, to form a first trench in the third region that exposes the third region, forming a second trench by etching the exposed third region using the first and second dummy spacers as masks to separate the pre-fin into first and second active fins corresponding to the first and second regions, respectively, forming a dummy gate by filling the first and second trenches and removing the first and second dummy spacers.

In an example embodiment of the present inventive concept, the method further includes forming first and second spacers on side surfaces of the first and second gates, respectively, and forming a third spacer on side surfaces of the dummy gate. In an example embodiment, the first, second, and third spacers are formed simultaneously.

In an example embodiment of the present inventive concept, the method further includes after forming the pre-fin, forming a field insulating film to surround the pre-fin, wherein an upper surface of the field insulating film is lower than an upper surface of the dummy gate.

In an example embodiment of the present inventive concept, the forming the first and second gates includes forming a gate layer, forming a pattern film on the gate layer and patterning the gate layer using the pattern film as a mask.

In an example embodiment of the present inventive concept, the removing the first and second dummy spacers includes using wet etching.

In an example embodiment of the present inventive concept, the pattern film and the first and second dummy spacers have etching selectivity, and wherein the removing the first and second dummy spacers include removing the first and second dummy spacers using the pattern film as a mask.

In an example embodiment of the present inventive concept, the forming the first and second gates further comprises forming a third gate on the first active fin to extend in the second direction and to be spaced apart from the first gate in the first direction, and a fourth gate on the second active fin to extend in the second direction and to be spaced apart from the second gate in the first direction, and wherein the first and second gates are located between the third and fourth gates.

In an example embodiment of the present inventive concept, the method further includes after forming the pre-fin, forming a field insulating film to surround the pre-fin, wherein a portion of a width of the third gate in the first direction overlaps with the first active fin, and the other portion of the width of the third gate in the first direction overlaps with the field insulation film.

In an example embodiment of the present inventive concept, the dummy gate includes at least one of an oxide film and a nitride film.

In an example embodiment of the present inventive concept, the method further includes forming a first elevated source/drain on side surfaces of the first gate and a second elevated source/drain on side surfaces of the second gate, wherein an upper surface of the first elevated source/drain is located on the same plane with an upper surface of the second elevated source/drain.

In an example embodiment of the present inventive concept, a width of the first and second gates in the first direction is the same as the width of the third region in the first direction.

According to an example embodiment of the present inventive concept, there is provided a method for fabricating a semiconductor device. The method includes forming a pre-fin, forming first and second gates intersecting the pre-fin and extending in parallel with each other, forming a dummy spacer including a first trench to expose the pre-fin between the first and second gates, the dummy spacer covering the pre-fin, dividing the pre-fin into first and second active fins by extending the first trench to a second trench, forming a dummy gate including an insulating material in the second trench and removing the dummy spacer.

In an example embodiment of the present inventive concept, an upper surface of the dummy gate is lower than upper surfaces of the first and second gates.

In an example embodiment of the present inventive concept, the extending the first trench to the second trench includes etching a portion of the pre-fin using the dummy spacer as a mask such that the second trench is aligned with the first trench.

In an example embodiment of the present inventive concept, a height of the dummy gate is the same as or lower than the first and second gates.

According to an example embodiment of the present inventive concept, there is provided a method for fabricating a semiconductor device. The method includes performing a process on a semiconductor material to generate a semiconductor layer including first, second, and third regions, forming a first gate on the first region and a second gate on the second region, forming a first spacer on the first region and a second spacer on the second region, forming a trench by etching the third region using the first and second spacers as masks to separate the semiconductor layer into first and second fins, filling the trench with a first insulating layer, and removing the first and second spacers. The third region is disposed between the first and second regions.

In an example embodiment, the process forms the semiconductor layer by growing an epitaxial layer from the semiconductor material.

In an example embodiment, the method further includes forming a third gate on the first fin to be spaced apart from the first gate and a fourth gate on the second fin spaced apart from the second gate, where the first and second gates are located between the third and fourth gates.

In an example embodiment, the method further includes forming a second insulating layer to surround the semiconductor layer, wherein the third gate overlaps the first fin and a region of the second insulating layer.

In an example embodiment, the method further includes forming a third fin in parallel to and separated from the first fin, wherein the third gate overlaps the third fin.

BRIEF DESCRIPTION OF THE DRAWINGS

The present inventive concept will become more apparent by describing in detail example embodiments thereof with reference to the attached drawings, in which.

DETAILED DESCRIPTION

The present inventive concept will now be described more fully hereinafter with reference to the accompanying drawings, in which example embodiments of the inventive concept are shown. The inventive concept may, however, be embodied in different forms and should not be construed as limited to the example embodiments set forth herein. Rather, these embodiments are provided so that this disclosure will be thorough and complete, and will fully convey the scope of the inventive concept to those skilled in the art. The same reference numbers indicate the same components throughout the specification. In the attached figures, the thickness of layers and regions may be exaggerated for clarity.

It will be understood that when an element or layer is referred to as being "connected to," or "coupled to" another element or layer, it can be directly connected to or coupled to another element or layer or intervening elements or layers may be present. Like numbers refer to like elements throughout.

It will also be understood that when a layer is referred to as being "on" another layer or substrate, it can be directly on the other layer or substrate, or intervening layers may also be present.

The use of the terms "a" and "an" and "the" in the context of describing the invention (especially in the context of the following claims) are to be construed to cover both the singular and the plural, unless otherwise indicated herein or clearly contradicted by context.

Hereinafter, a semiconductor device according to an example embodiment of the inventive concept will be described with reference to FIGS. 1 to 3.

Figure 1:
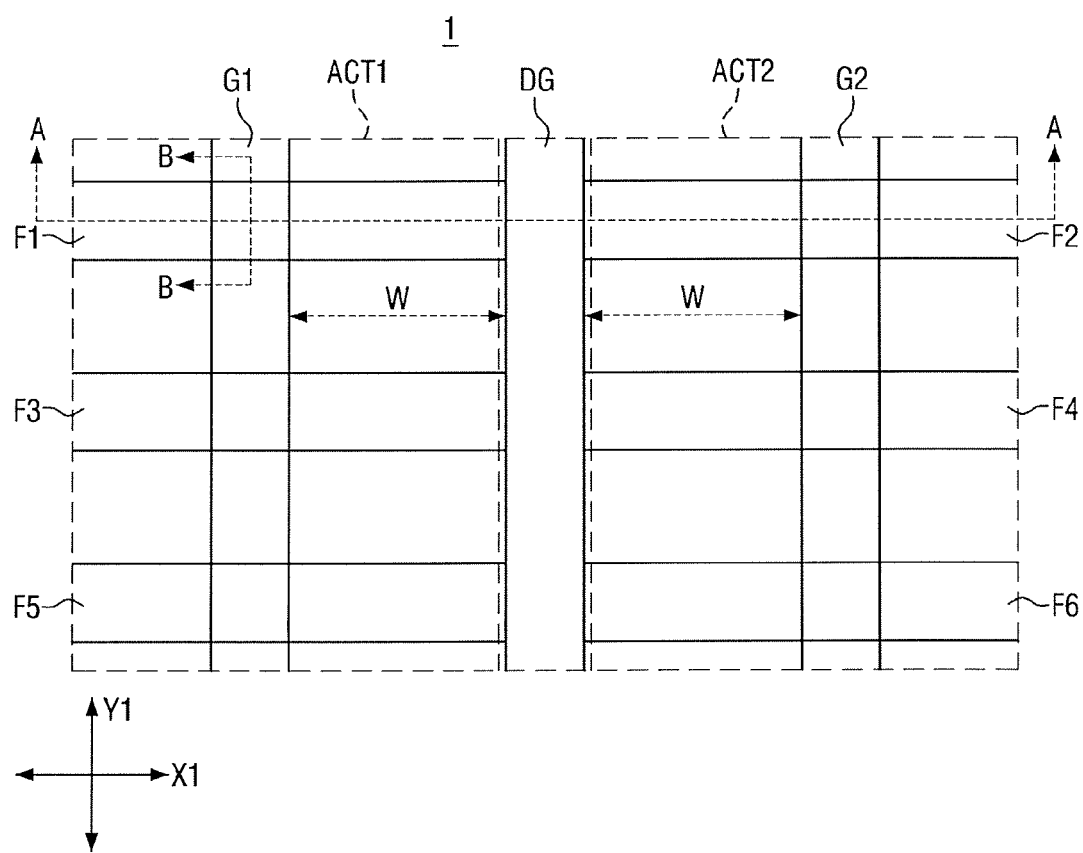
FIG. 1 is a layout diagram for explaining a semiconductor device according to an example embodiment of the present inventive concept.

FIG. 1 is a layout diagram for explaining a semiconductor device according to an example embodiment of the inventive concept. FIG. 2 is a cross-sectional view taken along line A-A of FIG. 1. FIG. 3 is a cross-sectional view taken along line B-B of FIG. 1.

Figure 3:
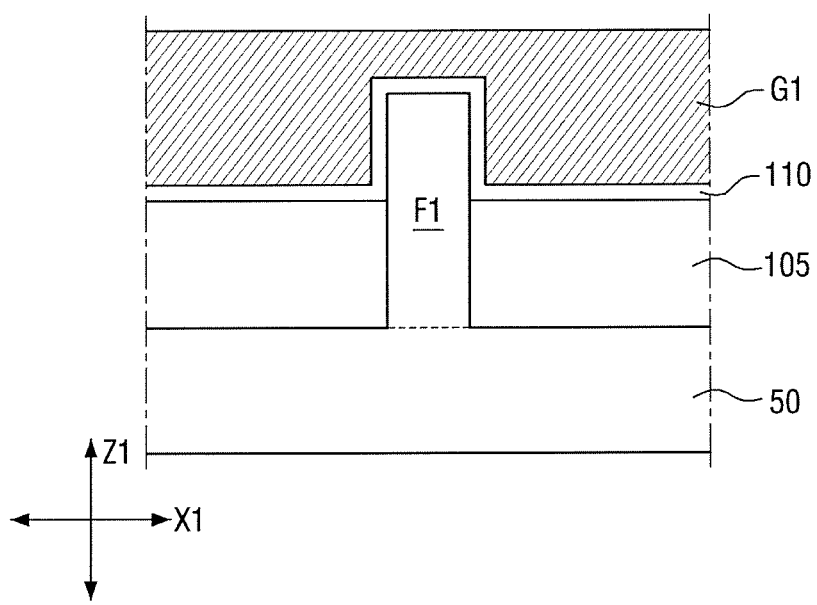
FIG. 3 is a cross-sectional view taken along line B-B of FIG. 1.

Referring to FIGS. 1 and 3, a semiconductor device 1 according to an example embodiment of the present inventive concept includes a plurality of active regions ACT1 and ACT2, a plurality of active fins F1 to F6, a dummy gate DG, and a plurality of gates G1 and G2.

As illustrated, the active regions ACT1 and ACT2 may be arranged in a matrix form, but the present inventive concept is not limited thereto. In an example embodiment, the first active region ACT1 is adjacent to the second active region ACT2 in a first direction X1. The active regions ACT1 and ACT2 may be defined by a dummy gate DG and a field insulating film 105.

In an example embodiment, in each of the active regions ACT1 and ACT2, at least one of the active fins F1 to F6 is arranged. For example, a plurality of active fins F1, F3 and F5 may be arranged in the first active region ACT1, and a plurality of active fins F2, F4 and F6 may be arranged in the second active region ACT2.

In an example embodiment, the active fins F1 to F6 are formed to extend in a first direction X1.

Some active fins (e.g., F1, F2) may be arranged side by side in a longitudinal direction (first direction X1) to be spaced apart from each other. Further, some active fins (e.g., F1, F3, F5) may be arranged adjacent to each other in a width direction (second direction Y1).

The active fins F1 to F6 may be elongated in the longitudinal direction (i.e., first direction X1). In an example embodiment, each of the active fins F1 to F6 has a long side and a short side. In FIG. 1, the long side direction is illustrated as the first direction X1, and the short side direction is illustrated as the second direction Y1, but the present inventive concept is not limited thereto. For example, in the active fins F1 to F6, the long side direction may be the second direction Y1, and the short side direction may be the first direction X1. In an example embodiment, the active fins F1 to F6 are formed to protrude from a substrate 50 in a third direction Z1.

The first and second active fins F1 and F2 may be elongated in the first direction X1. In an example embodiment, the first and second active fins F1 and F2 are part of the substrate 50 and may include an epitaxial layer grown from the substrate 50.

In the drawing, it has been illustrated that, for example, the first and second active fins F1 and F2 are formed in a rectangular shape, but the present inventive concept is not limited thereto. In an example embodiment, the first and second active fins F1 and F2 have a chamfered shape. In other words, an edge portion may have a rounded shape.

The first and second active fins F1 and F2 mean an active pattern used in a multi-gate transistor. That is, channels may be formed to be connected to each other along three surfaces of the first and second active fins F1 and F2, and channels may be formed on two facing surfaces of the first and second active fins F1 and F2. In an example embodiment, a channel region of a multi-gate transistor is formed on an active fin.

The first and second gate electrodes G1 and G2 are arranged to be spaced apart from each other. The first and second gate electrodes G1 and G2 may be arranged on the active fins F1 to F6 to intersect the active fins F1 to F6, respectively. Specifically, as shown in FIG. 1, the first gate electrode G1 is arranged on the first, third and fifth active fins F1, F3 and F5 among the active fins F1 to F6, and the second gate electrode G2 is arranged on the second, fourth and sixth active fins F2, F4 and F6 among the active fins F1 to F6.

Although it has been illustrated in FIG. 1 that the first and second gate electrodes G1 and G2 extend in the second direction Y1, the present inventive concept is not limited thereto. In an example embodiment, the first and second gate electrodes G1 and G2 intersect the first and second active fins F1 and F2 while forming an acute or obtuse angle with the active fins F1 to F6.

In an example embodiment, the first and second gate electrodes G1 and G2 are respectively formed on the first and second active fins F1 and F2 to intersect the first and second active fins F1 and F2 corresponding thereto. For example, the first gate electrode G1 may be formed on the first active fin F1, and the second gate electrode G2 may be formed on the second active fin F2.

In an example embodiment, the dummy gate DG is formed to be elongated in the second direction Y1 intersecting the first direction X1. In an example embodiment, the first and second gate electrodes G1 and G2 are formed to be separated from the dummy gate DG and elongated in the second direction Y1. Although only two gates (i.e., G1 and G2) are illustrated in the embodiment, the present inventive concept is not limited thereto.

In an example embodiment, a first distance w between the dummy gate DG and the first gate electrode G1 is the same as a second distance w between the dummy gate DG and the second gate electrode G2. That is, the first gate electrode G1, the dummy gate DG and the second gate electrode G2 may be arranged side by side at constant intervals. In an example embodiment, the first distance is slightly different from the second distance. In an example embodiment, the intervals are slightly different from one another.

The dummy gate DG separates the first active fin F1 and the second active fin F2 from each other. In an example embodiment, the dummy gate DG is in contact with one cross-section of the first active fin F1. In an example embodiment, the dummy gate DG is in contact with one cross-section of the second active fin F2. That is, as illustrated, the dummy gate DG is in contact with the facing cross-sections of the first active fin F1 and the second active fin F2.

The dummy gate DG may extend in the second direction Y1. In an example embodiment, the dummy gate DG separates and insulates the active fins F1 to F6 from each other while extending in the second direction Y1. In an example embodiment, the dummy gate DG separates and insulates the first active fin F1 from the second active fin F2, the third active fin F3 from the fourth active fin F4, and the fifth active fin F5 from the sixth active fin F6.

Figure 2:
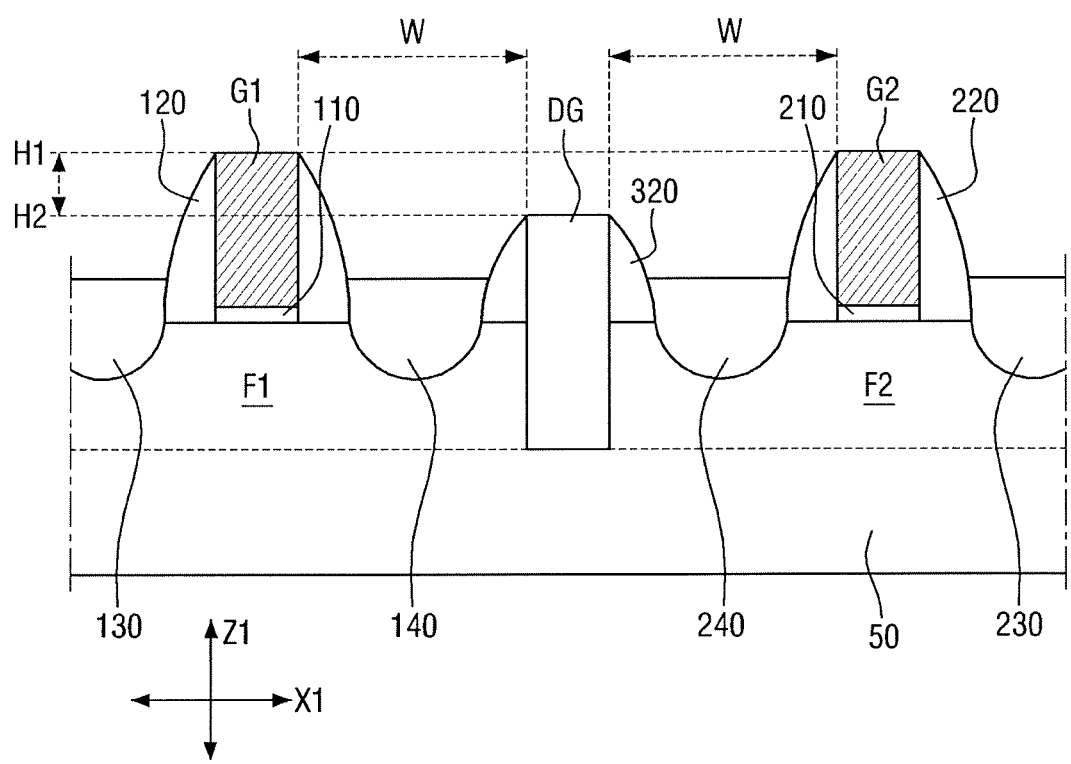
FIG. 2 is a cross-sectional view taken along line A-A of FIG. 1.

Referring to FIG. 2, the semiconductor device 1 according to the embodiment of the present inventive concept includes the substrate 50, the first active fin F1, the second active fin F2, the first gate electrode G1, the second gate electrode G2, the dummy gate DG, a first spacer 120, a second spacer 220, a first gate insulating film 110, a second gate insulating film 210, and a plurality of source/drain regions 130, 140, 230 and 240. In an example embodiment, a source/drain region includes a source electrode and a drain electrode of a multi-gate transistor.

In an example embodiment, the substrate 50 is formed of at least one semiconductor material selected from the group consisting of Si, Ge, SiGe, GaP, GaAs, SiC, SiGeC, InAs and InP. That is, the substrate 50 may be a silicon substrate, a silicon-on-insulator (SOI) substrate, a GaAs substrate, a silicon germanium substrate, a ceramic substrate, a quartz substrate, a rigid substrate such as a glass substrate for a display, or a flexible plastic substrate such as polyimide, polyester, polycarbonate, polyethersulfone, polymethylmethacrylate, polyethylene naphthalate, and polyethyleneterephthalate.

In an example embodiment, each of the first and second gate electrodes G1 and G2 include a plurality of metal layers. Each of the first and second gate electrodes G1 and G2 may be formed by stacking two or more metal layers. For example, any one of the metal layers included in the first and second gate electrodes G1 and G2 may include at least one of TiN, TaN, TiC, TiAlC and TaC. Further, the other one of the metal layers included in the first and second gate electrodes G1 and G2 may include W or Al. Alternatively, the first and second gate electrodes G1 and G2 may be formed of a non-metal material such as Si or SiGe.

The first gate insulating film 110 is formed between the first active fin F1 and the first gate electrode G1 and the second gate insulating film 210 is formed between the second active fin F2 and the second gate electrode G2. As shown in FIG. 3, the first and second gate insulating films 110 and 210 may be formed on the first and second active fins F1 and F2, respectively. In an example embodiment, the first and second gate insulating films 110 and 210 include a high dielectric material having a dielectric constant higher than that of a silicon oxide film. For example, the first and second gate insulating films 110 and 210 may include $HfO_2$, $ZrO_2$, LaO, $Al_2O_3$ or $Ta_2O_5$.

The first and second spacers 120 and 220 are formed on sidewalls of the first and second gate electrodes G1 and G2. In an example embodiment, the first spacer 120 is disposed on the sidewalls of the first gate electrode G1, and the second spacer 220 is disposed on the sidewalls of the second gate electrode G2.

The first and second spacers 120 and 220 may include at least one of a nitride film and an oxynitride film, and may be formed of a plurality of layers rather than a single layer unlike the illustration in the figure.

The first and second source/drain regions 130, 140, 230 and 240 may be disposed on the sides of the first and second gate electrodes G1 and G2. In an example embodiment, the first source/drain regions 130 and 140 are disposed on both sides of the first gate electrode G1, and the second source/drain regions 230 and 240 are located on both sides of the second gate electrode G2. One of the first source/drain regions 130 and 140 may be formed between the first gate electrode G1 and the dummy gate DG. One of the second source/drain regions 230 and 240 may be formed between the second gate electrode G2 and the dummy gate DG.

In an example embodiment where the semiconductor device 1 is a P-type metal-oxide-semiconductor PMOS transistor, the first and second source/drain regions 130, 140, 230 and 240 include a compressive stress material. For example, the compressive stress material may be a material, such as SiGe, having a large lattice constant compared to Si. The compressive stress material may apply a compressive stress to a channel region below the first and second gate electrodes G1 and G2, thereby improving the mobility of carriers of the channel region.

In an example embodiment where the semiconductor device 1 is an N-type metal-oxide semiconductor NMOS transistor, the first and second source/drain regions 130, 140, 230 and 240 includes a tensile stress material. The first and second source/drain regions 130, 140, 230 and 240 may be made of the same material as the substrate 50, or the tensile stress material. For example, when the substrate 50 is made of Si, the source/drain regions 130, 140, 230 and 240 may be made of Si, or a material (e.g., SiC, SiP) having a lattice constant smaller than that of Si.

In an example embodiment, the first and second source/drain regions 130, 140, 230 and 240 are formed by epitaxial growth.

In an example embodiment, the first and second source/drain regions 130, 140, 230 and 240 have an elevated source/drain structure protruding from the first and second active fins F1 and F2.

In an example embodiment, the upper surfaces of the first source/drain regions 130 and 140 disposed on the sides of the first gate electrode G1 are positioned on the same plane with the upper surfaces of the second source/drain regions 230 and 240 disposed on the sides of the second gate electrode G2. However, if the process used to position the upper surfaces on the same plane is imprecise, the upper surfaces may not be exactly aligned in the same plane. In an example embodiment, the first and second source/drain regions 130, 140, 230 and 240 are formed by epitaxial growth for a period of time sufficient to position the upper surfaces on the same plane.

In an example embodiment of the inventive concept, the first and second source/drain regions 130, 140, 230 and 240 are formed by doping impurities into the first and second active fins F1 and F2.

The first gate electrode G1, the first gate insulating film 110, the first spacer 120 and the first source/drain regions 130 and 140 are formed on the first active fin F1. Correspondingly, the second gate electrode G2, the second gate insulating film 210, the second spacer 220 and the second source/drain regions 230 and 240 are formed on the second active fin F2.

The dummy gate DG is located between the first active fin F1 and the second active fin F2. The dummy gate DG may be formed to protrude from the upper surfaces of the first active fin F1 and the second active fin F2. In an example embodiment, the upper surface of the dummy gate DG has a height H2 higher than the upper surfaces of the first and second active fins F1 and F2. In an example embodiment, the height H2 of the upper surface of the dummy gate DG is lower than a height H1 of the upper surfaces of the first and second gate electrodes G1 and G2. As illustrated, a third spacer 320 is also formed to be lower than the first and second spacers 120 and 220.

The width of the first gate electrode G1 and the second gate electrode G2 in the first direction X1 may be the same as the width of the dummy gate DG in the first direction X1. That is, the first gate electrode G1, the second gate electrode G2 and the dummy gate DG may have the same dimensions and may include different materials therein.

The third spacer 320 may be formed on the side surfaces of the dummy gate DG. The third spacer 320 may be formed at the same time as the first and second spacers 120 and 220, but the present inventive concept is not limited thereto. The third spacer 320 may include the same material as the first and second spacers 120 and 220. That is, the third spacer 320 may include at least one of a nitride film and an oxynitride film and may be formed of a plurality of layers rather than the single layer shown in the figure.

Referring to FIG. 3, the semiconductor device 1 according to an embodiment of the present inventive concept includes a field insulating film 105.

In an example embodiment, the field insulating film 105 is formed on the substrate 50, and is formed to surround at least a portion of the active fins F1 to F6. The field insulating film 105 may be, for example, an oxide film, a nitride film, an oxynitride film or a combination thereof. The field insulating film 105 may be formed of the same material as the dummy gate DG.

The field insulating film 105 may be formed to contact with the short sides and the long sides of the active fins F1 to F6. In an example embodiment, the dummy gate DG is in contact with the facing short sides of the first active fin F1 and the second active fin F2. The dummy gate DG may be in contact with the facing short sides of the third active fin F3 and the fourth active fin F4. The dummy gate DG may be in contact with the facing short sides of the fifth active fin F5 and the sixth active fin F6. The field insulating film 105 may be formed in contact with all the other short sides and long sides of the active fins F1 to F6.

In an example embodiment, the height of the upper surface of the field insulating film 105 is lower than the height of the upper surfaces of the active fins F1 to F6. However, the present inventive concept is not limited thereto, and the upper surfaces of the active fins F1 to F6 may be located on the same plane with the upper surface of the field insulating film 105. The upper surface of the field insulating film 105 may be lower than the upper surface of the dummy gate DG. Thus, only one cross-section of the active fins F1 to F6 may be in contact with the high dummy gate DG, and the other short sides and long sides thereof may be in contact with the field insulating film 105.

In the semiconductor device 1 according to the embodiment of the present inventive concept, the size of a cell can be reduced by easily cutting a fin element in a semiconductor device which becomes finer and has higher integration.

Specifically, it is possible to increase the integration of the semiconductor device by dividing one fin into a plurality of elements. Accordingly, it is possible to improve the capacity, efficiency and speed of the semiconductor device.

However, for this purpose, rather than a double diffusion break in which fins are spaced apart from each other at regular intervals at which the gate electrodes are spaced apart from each other, a single diffusion break in which fins are spaced apart from each other within the width of one gate electrode may be advantageous in terms of space margin, and more devices may be implemented in the same space.

However, the implementation of the single diffusion break may cause difficulties in the process as the overall scale of the semiconductor device becomes smaller. For example, an alignment error between the fins and a mandrel mask may occur, and it may cause a problem that it is difficult to form a gate structure on the separated fins.

However, in the semiconductor device 1 according to the embodiment of the present inventive concept, it is possible to avoid a problem in the process while obtaining a fin cutting effect of the same scale as the structure of the single diffusion break by using a dummy gate electrode instead of an actual gate electrode in a cutting portion of the fin. Furthermore, a trench for the cutting of the fin can be self-aligned, and the reliability of the process can be also enhanced.

Hereinafter, a method for fabricating a semiconductor device according to an example embodiment of the present inventive concept will be described with reference to FIGS. 1 to 16. FIGS. 4 to 16 are diagrams showing steps for explaining a method for fabricating the semiconductor device of FIG. 1. Specifically, FIGS. 4 to 6, 8, 10, 12, 14 and 16 are cross-sectional views taken along line A-A, and FIGS. 7, 9, 11 and 13 are plan views.

Figure 4:
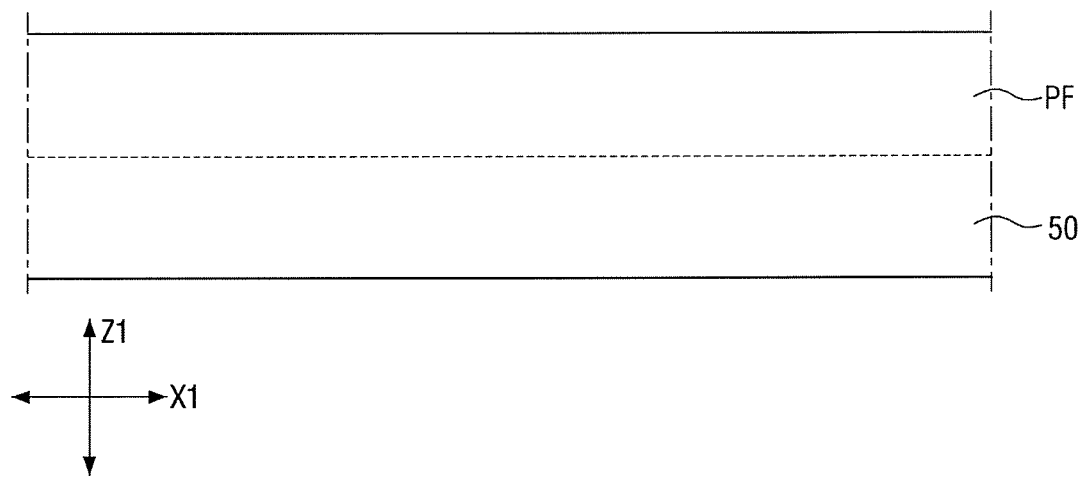
FIGS. 4 to 16 are diagrams for explaining a method for fabricating the semiconductor device of FIG. 1 according to an example embodiment of the inventive concept.

Referring to FIG. 4, a pre-fin PF is formed on the substrate 50. The pre-fin PF may be referred to as a semiconductor layer. The pre-fin PF may be divided into the first active fin F1 and the second active fin F2 later. The pre-fin PF may be formed on the substrate 50 to protrude in the third direction Z1. The pre-fin PF may be part of the substrate 50, and may include an epitaxial layer grown from the substrate 50.

The pre-fin PF may be formed to extend in the first direction X1. The pre-fin PF may be a member before cutting into the plurality of active fins F1 to F6. The pre-fin PF may be provided plurally, and may be divided into two portions. Specifically, the pre-fin PF may be divided into the first and second active fins F1 and F2.

Each pre-fin PF may have a long side and a short side. The long side of the pre-fin PF may extend in the first direction X1, and the short side of the pre-fin PF may extend in the second direction Y1, but the present inventive concept is not limited thereto.

Although not shown in FIG. 4, the field insulating film 105 may be formed between the protruding pre-fins PF. The field insulating film 105 may be formed on the substrate 50, and may be formed to surround at least a portion of the active fins F1 to F6. The field insulating film 105 may be, for example, an oxide film, a nitride film, an oxynitride film or a combination thereof.

Figure 5:
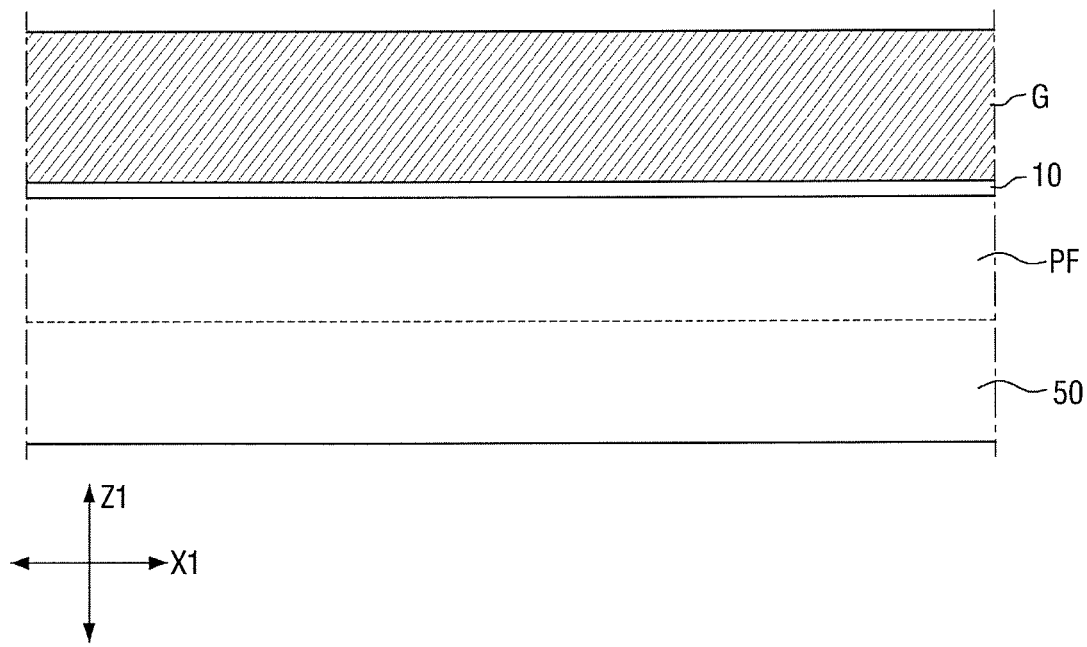

Referring to FIGS. 3 and 5, a gate insulating layer 10 and a gate layer G are sequentially formed on the pre-fins PF and the field insulating film 105. Although not shown in FIG. 5, with reference to FIG. 3, the gate insulating layer 10 and the gate layer G may also be formed sequentially on the field insulating film 105.

The gate insulating layer 10 may become the first and second gate insulating films 110 and 210 shown in FIG. 8 through an etching process to be described later. Also, the gate layer G may become the first and second gate electrodes G1 and G2 shown in FIG. 8 through an etching process to be described later.

Figure 6:
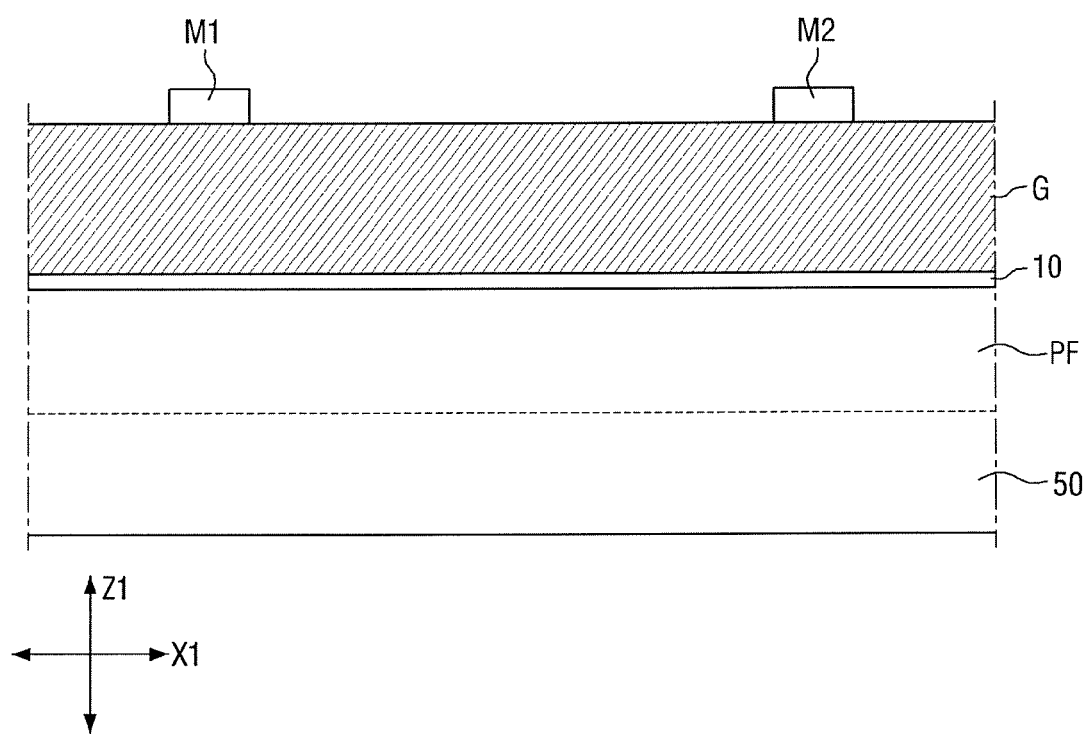

Referring to FIG. 6, first and second pattern films M1 and M2 are formed on the gate layer G. The first and second pattern films M1 and M2 serve as masks. That is, the first and second pattern films M1 and M2 are masks for forming the first and second gate electrodes G1 and G2 and the first and second gate insulating films 110 and 210, respectively.

That is, the first pattern film M1 may be formed at a position for forming the first gate electrode G1 and the first gate insulating film 110. Correspondingly, the second pattern film M2 may be formed at a position for forming the second gate electrode G2 and the second gate insulating film 210.

In an example embodiment, the first width of the first pattern film M1 in the first direction X1 is the same as the second width of the second pattern film M2 in the first direction X1. Accordingly, the first gate electrode G1 and the second gate electrode G2 also have the same width. In an example embodiment, the first width may differ slightly from the second width when the process used to make the pattern films M1 and M2 has an error.

Although not shown, a mandrel layer is first formed on the gate layer G, and a pattern film for the mask may be formed thereon. That is, it may be possible by using a method for selectively etching the gate layer G and the gate insulating layer 10.

Figure 7:
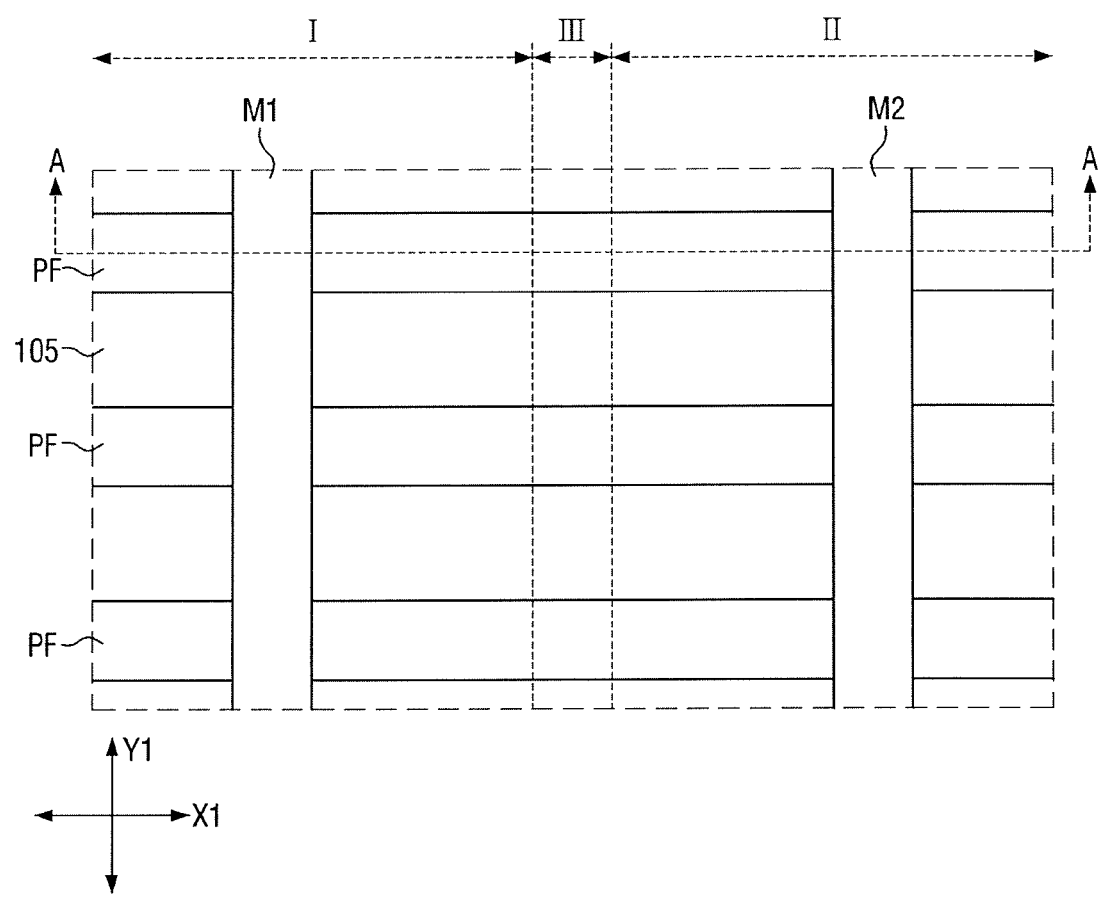
Figure 8:
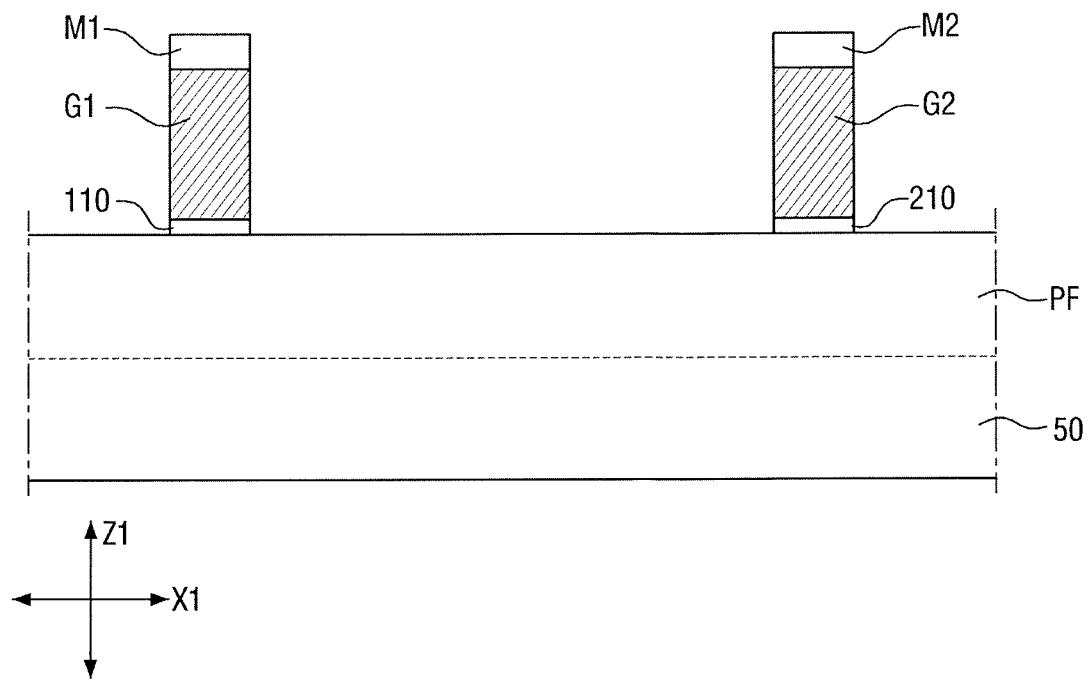

Referring to FIGS. 7 and 8, the pre-fin PF includes first to third regions I to III.

The first region I is a region where the first active fin F1 will be formed later. The second region II is a region where the second active fin F2 will be formed later. The third region III is located between the first region I and the second region II. In the third region III, the dummy gate DG is formed later.

That is, the pre-fin PF is divided into the first active fin F1 of the first region I and the second active fin F2 of the second region II by the dummy gate DG formed in the third region III.

The first pattern film M1 is arranged on the first region I of the pre-fins PF to extend in the second direction Y1. The first pattern film M1 may be formed in the same shape as the first gate electrode G1, and serves as a mask to enable the first gate electrode G1 to be formed by an etching process.

The second pattern film M2 is arranged on the second region II of the pre-fins PF to extend in the second direction Y1. The second pattern film M2 may be formed in the same shape as the second gate electrode G2, and serves as a mask to enable the second gate electrode G2 to be formed by an etching process.

As described above, the field insulating film 105 may be formed between the pre-fins PF. In an example embodiment, the height of the upper surface of the field insulating film 105 is lower than the height of the upper surfaces of the pre-fins PF.

The gate layer G and the gate insulating layer 10 may be selectively etched using the first and second pattern films M1 and M2 as masks. Thus, the gate layer G and the gate insulating layer 10 may have the same shape as the first and second pattern films M1 and M2. Specifically, the gate layer G is formed to be divided into the first gate electrode G1 and the second gate electrode G2. Further, the gate insulating layer 10 is formed to be divided into the first gate insulating film 110 and the second gate insulating film 210.

That is, as shown in FIG. 8, the first gate electrode G1 is formed on the first gate insulating film 110 on the pre-fins PF, and the first pattern film M1 is formed on the first gate electrode G1. This stacked structure may be formed in the first region I of FIG. 7.

The second gate electrode G2 is formed on the second gate insulating film 210 on the pre-fins PF, and the second pattern film M2 is formed on the second gate electrode G2. This stacked structure may be formed in the second region II of FIG. 7.

Figure 9:
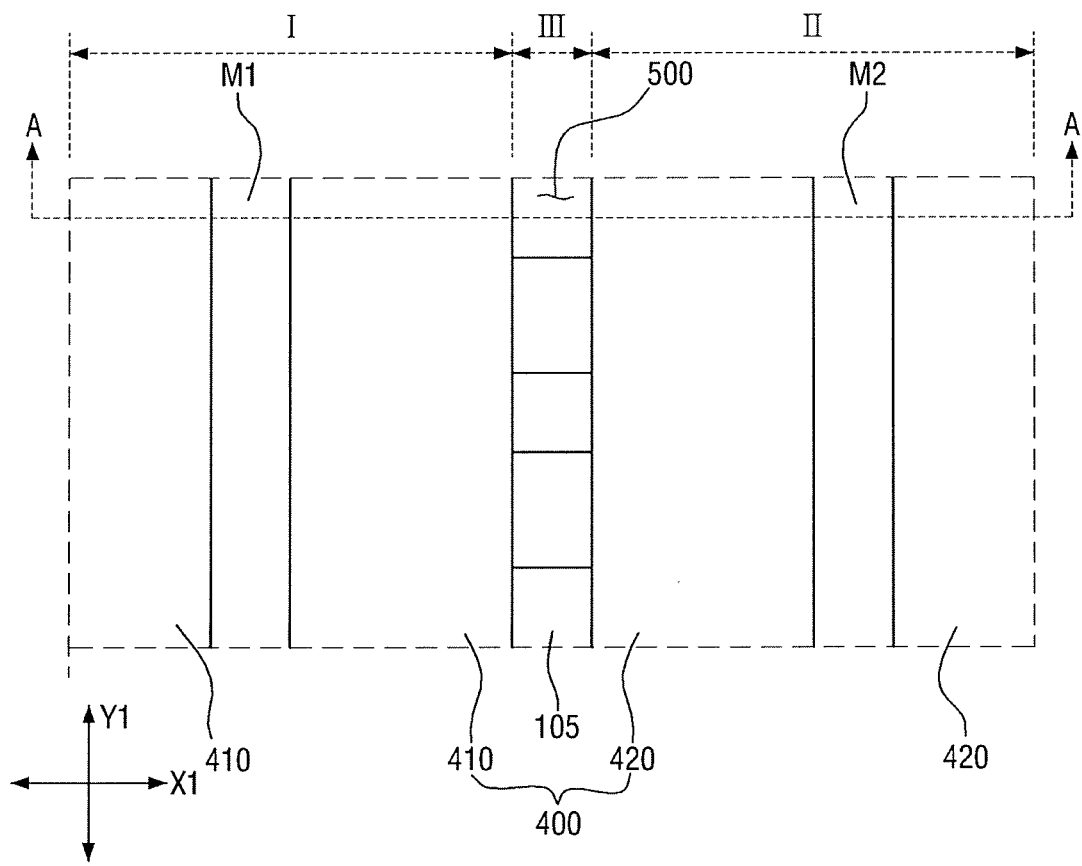
Figure 10:
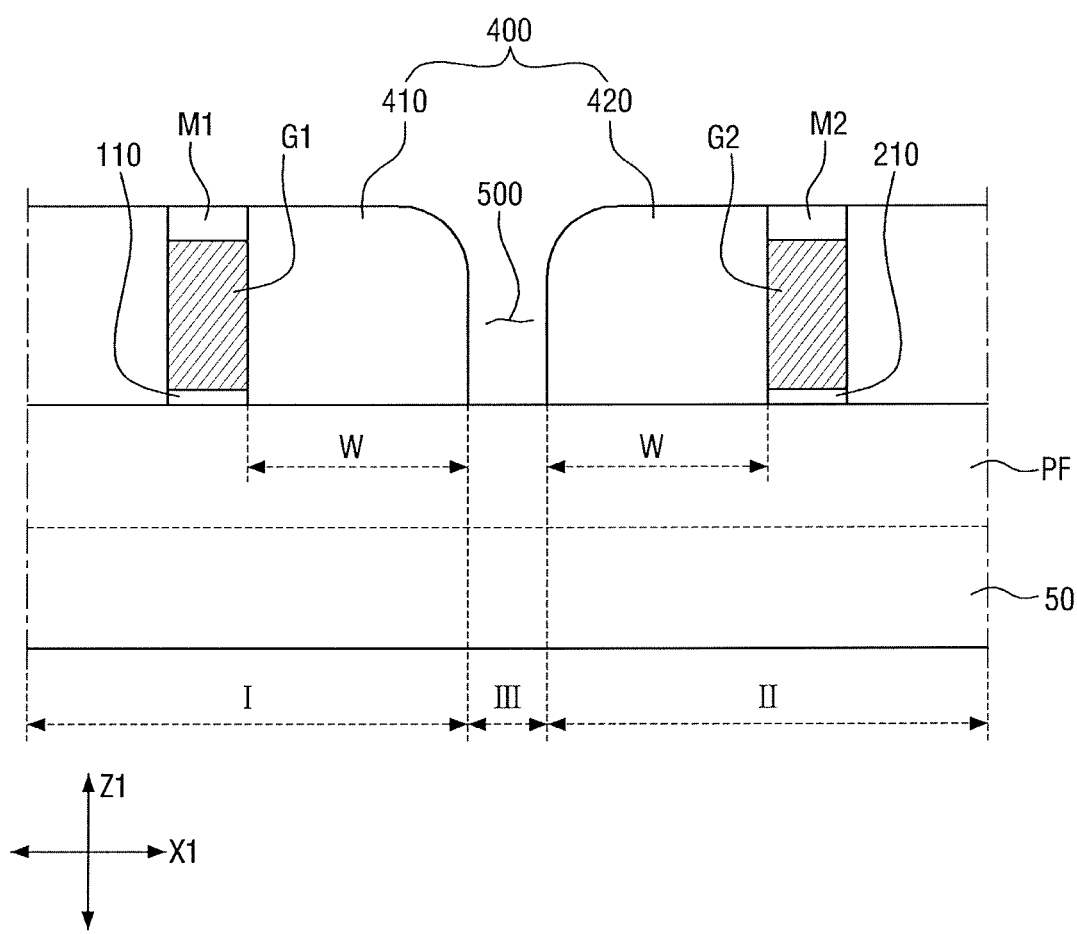

Referring to FIGS. 9 and 10, dummy spacers 400 are formed in the first region I and the second region II. Specifically, a first dummy spacer 410 is formed in the first region I, and a second dummy spacer 420 is formed in the second region II. The dummy spacer 400 is not formed in the third region III. That is, in the third region III, the upper surfaces of the pre-fins PF and the field insulating film 105 are exposed.

The width of the third region III in the first direction X1 may be the same as the width of the first gate electrode G1 and the second gate electrode G2 in the first direction X1. Accordingly, the width of the dummy gate DG formed in the third region III in the first direction X1 may be substantially the same as the width of the first gate electrode G1 and the second gate electrode G2 in the first direction X1.

The height of the upper surfaces of the dummy spacers 400 may be substantially the same as the height of the upper surfaces of the first and second pattern films M1 and M2. That is, after the dummy spacer 400 is sufficiently deposited, a planarization process such as a chemical mechanical polishing (CMP) process may be performed to expose the upper surfaces of the first and second pattern films M1 and M2.

In an example embodiment, the first distance w of the first gate electrode G1 from the third region III is the same as or substantially the same as the second distance w of the second gate electrode G2 from the third region III. In an example embodiment, the first distance is slightly different from the second distance.

In an example embodiment, the dummy spacers 400 include at least one of SiN, SiBCN and SiOCN, but the present inventive concept is not limited thereto. The dummy spacers 400 may be formed by chemical vapor deposition (CVD) or atomic layer deposition (ALD), but the present inventive concept is not limited thereto.

The dummy spacers 400 form a first trench 500 in the third region III. That is, sidewalls of the first trench 500 may be the first dummy spacer 410 and the second dummy spacer 420. For example, one side of the first trench 500 corresponds to one side of the first dummy spacer 410 and another side of the first trench corresponds to one side of the second dummy spacer 420.

The bottom surface of the first trench 500 may be part of the field insulating film 105 and the upper surfaces of the pre-fins PF in the third region III. Since the height of the upper surfaces of the pre-fins PF is different from the height of the upper surface of the field insulating film 105, the bottom surface of the first trench 500 may include a protruding portion. The first trench 500 may extend in parallel with the first and second gate electrodes G1 and G2 in the second direction Y1.

Figure 11:
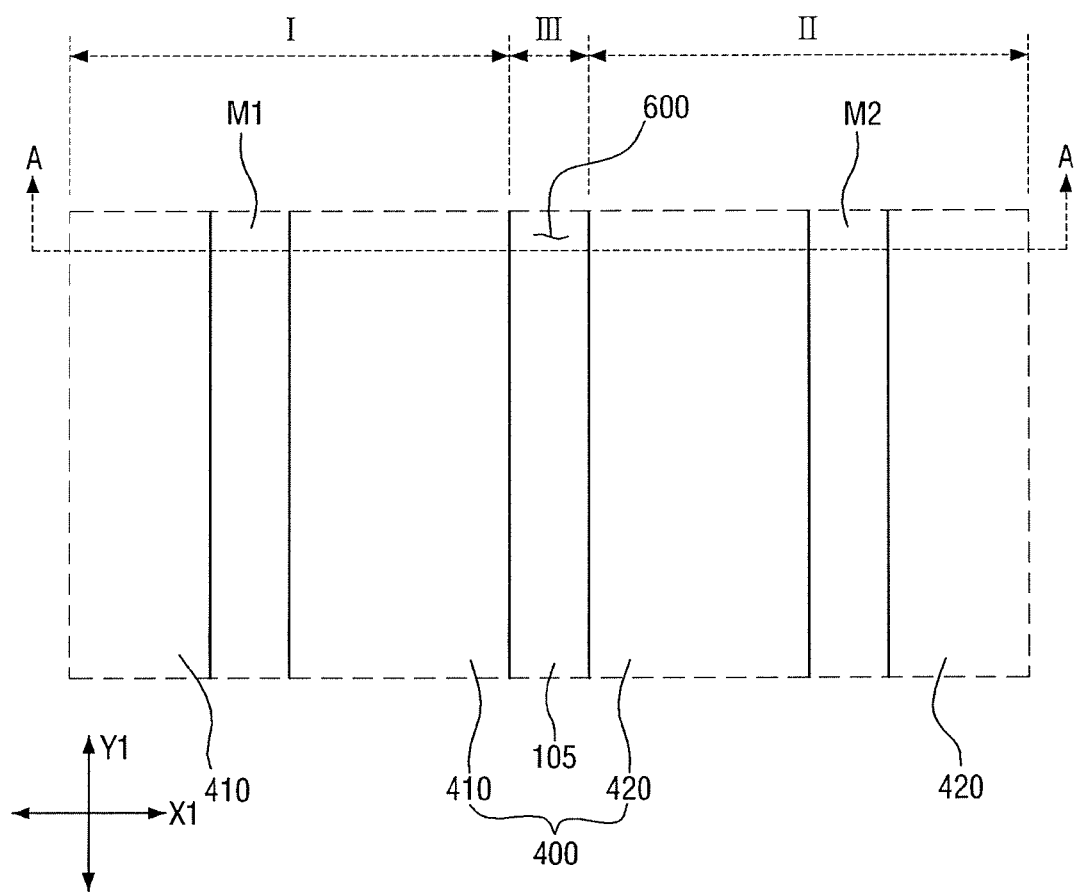
Figure 12:
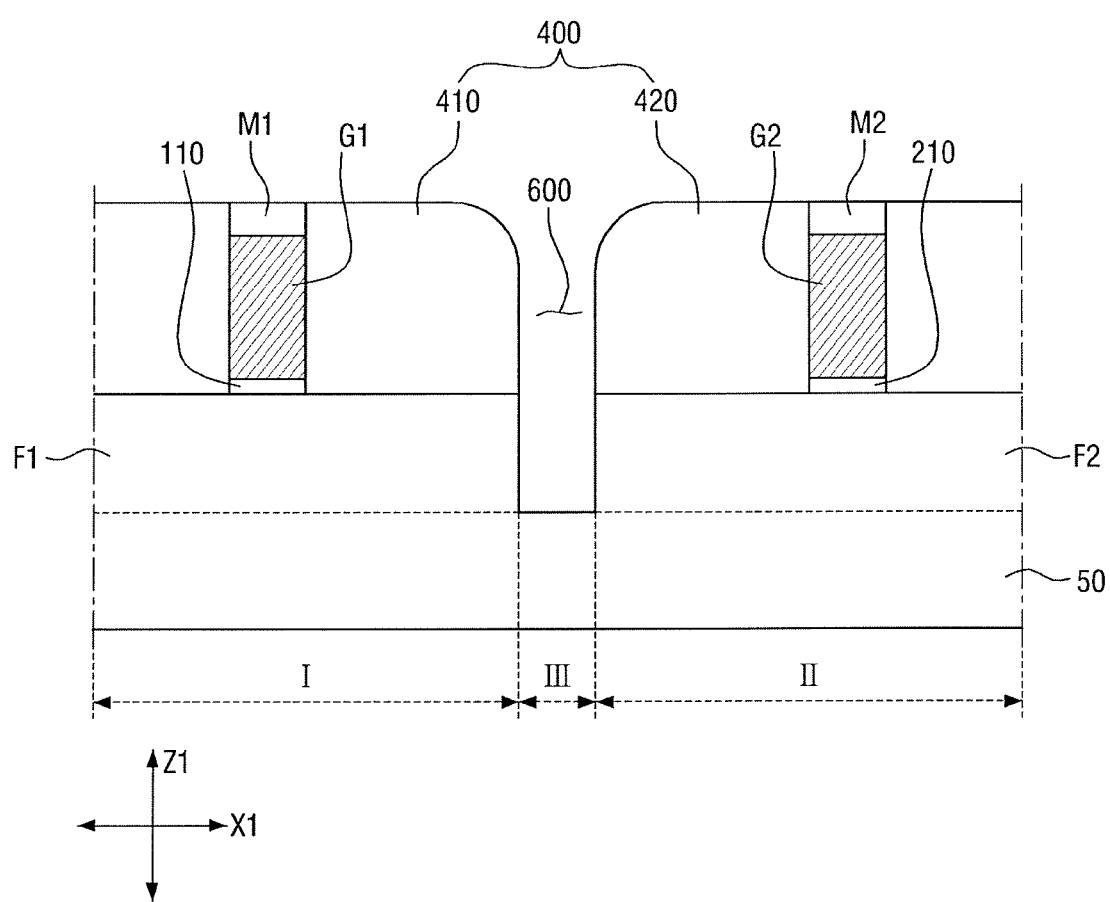

Referring to FIGS. 11 and 12, a second trench 600 is formed by removing the third region III of the pre-fins PF illustrated in FIG. 10. The second trench 600 may be formed by self-alignment between the first dummy spacer 410 and the second dummy spacer 420. That is, the second trench 600 may be formed by removing the bottom surface of the first trench 500 at the greater depth. The second trench 600 may be formed by an etch-back process of the pre-fins PF. Accordingly, the width of the first trench 500 and the second trench 600 in the first direction X1 may be the same as the width of the first gate electrode G1 and the second gate electrode G2.

When the second trench 600 is formed, the pre-fin PF is divided into the first active fin F1 and the second active fin F2. The first active fin F1 and the second active fin F2 may operate as different semiconductor devices. Accordingly, it is possible to further improve the integration and performance of semiconductor devices.

In a single diffusion break process, misalignment may be problematic when cutting the fins and forming the gates thereon. However, according to a method of fabricating a semiconductor device according to an example embodiment of the present inventive concept, since the pre-fins PF are cut after being self-aligned by the dummy spacers 400, the alignment for the cutting of a plurality of fins can be easily performed even in semiconductor devices with a very small scale. Accordingly, it is possible to fabricate a semiconductor device with high reliability, high integration and improved performance.

Figure 13:
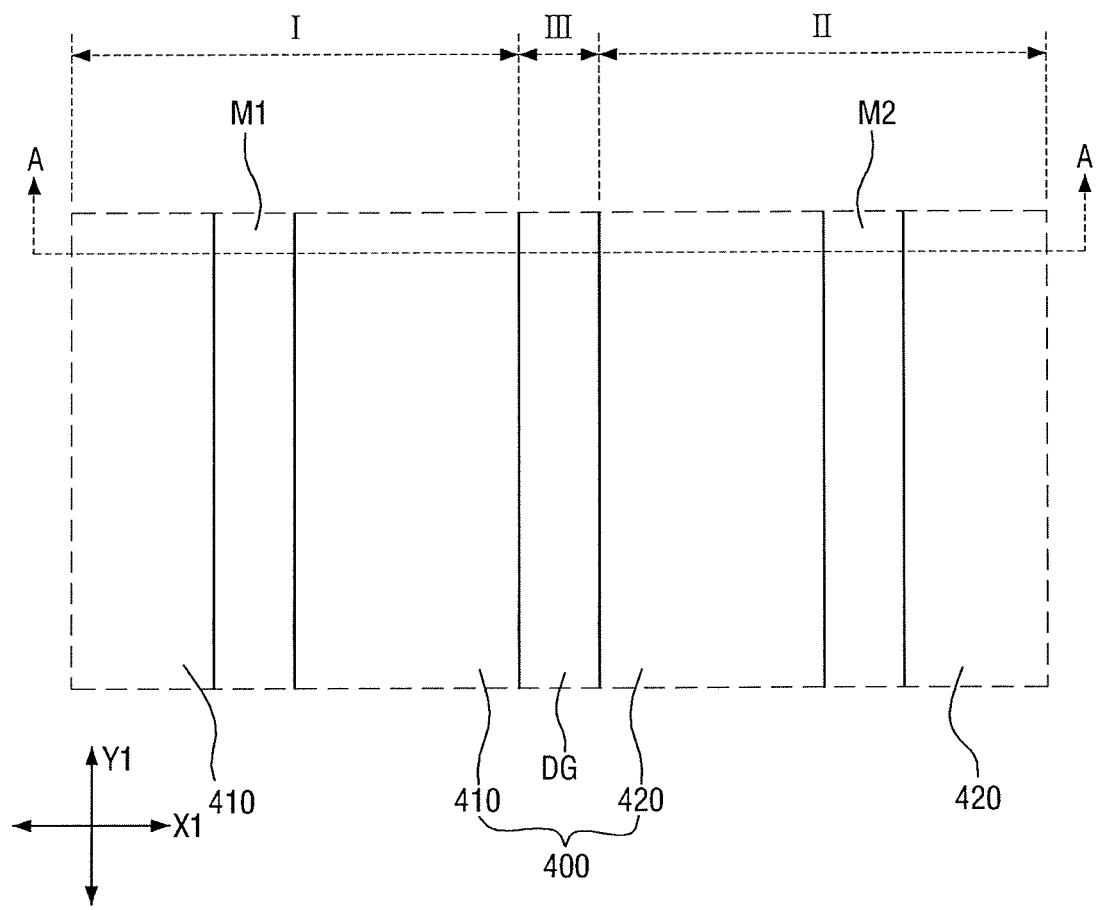
Figure 14:
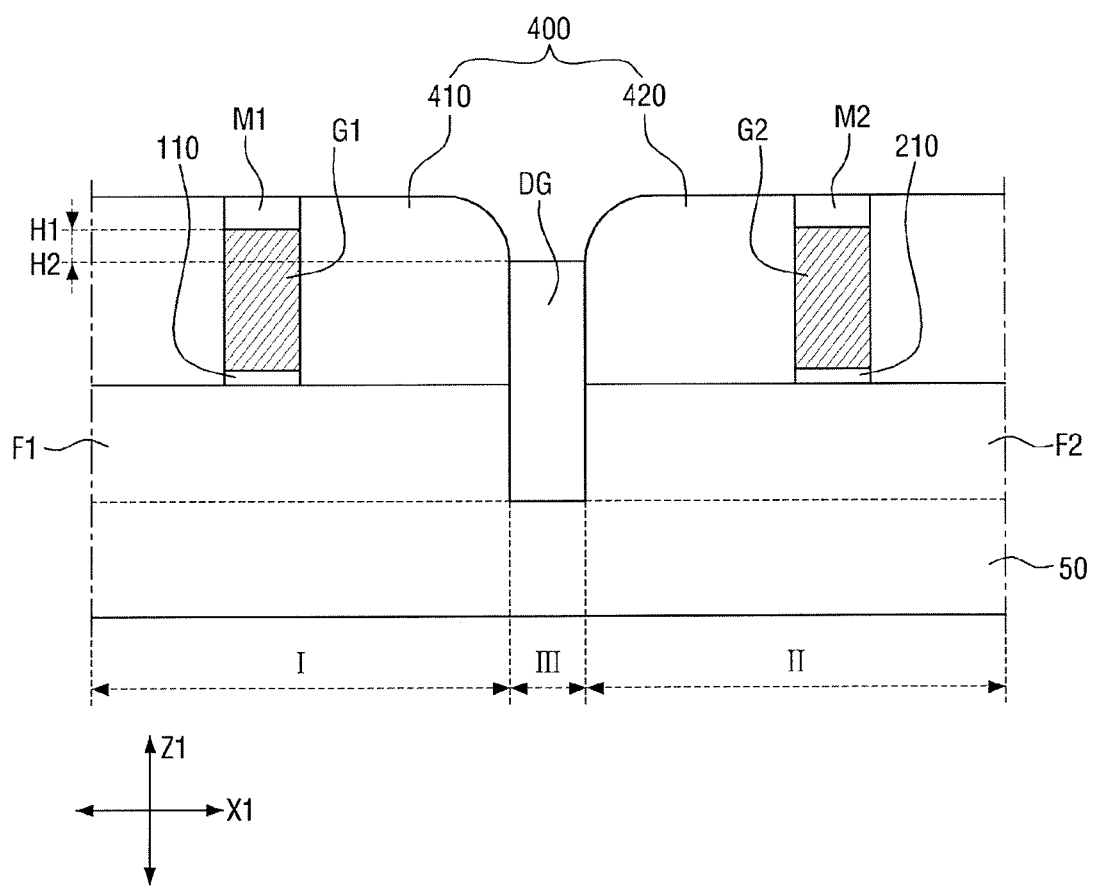

Referring to FIGS. 13 and 14, the dummy gate DG is formed by filling the second trench 600. In an example embodiment, the dummy gate DG is formed of the same material as the field insulating film 105. That is, the dummy gate DG may be formed of the same material as the field insulating film 105, which remains in the second trench 600. That is, the dummy gate DG may be, for example, an oxide film, a nitride film, an oxynitride film or a combination thereof.

The height H2 of the dummy gate DG is lower than the height H1 of the first and second gate electrodes G1 and G2. This is because the vertical height of the first trench 500 formed by the dummy spacers 400 is lower than the height of the first and second gate electrodes G1 and G2. However, the present inventive concept is not limited thereto. The height of the upper surface of the dummy gate DG may be higher than the height of the upper surfaces of the first and second active fins F1 and F2.

Since the dummy gate DG is filled in the second trench 600, the dummy gate DG may extend in the second direction Y1. The dummy gate DG is located between the first gate electrode G1 and the second gate electrode G2. Further, the dummy gate DG may be disposed at a position where the distance w from the first gate electrode G1 is the same as the distance w from the second gate electrode G2. This is because the dummy gate DG is formed instead at a place where an actual gate electrode was previously formed in the conventional semiconductor device in order to replace the single diffusion break.

Figure 15:
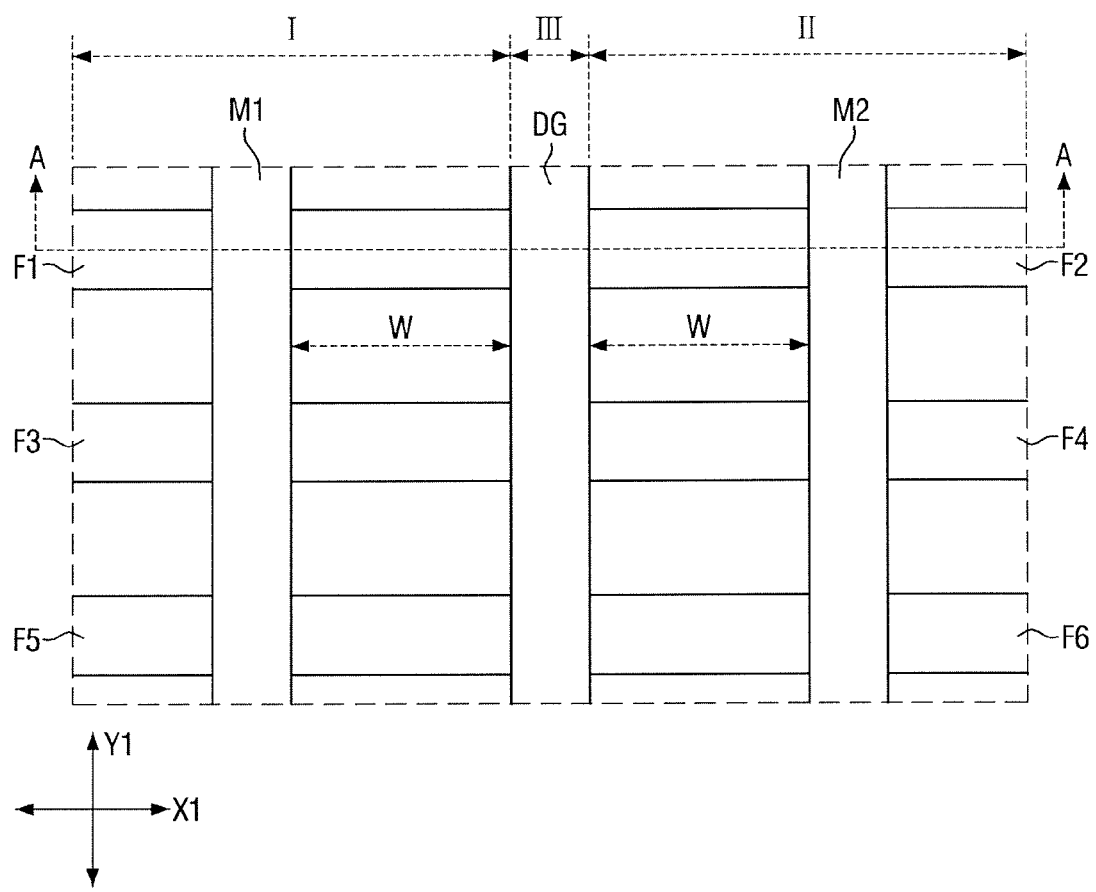
Figure 16:
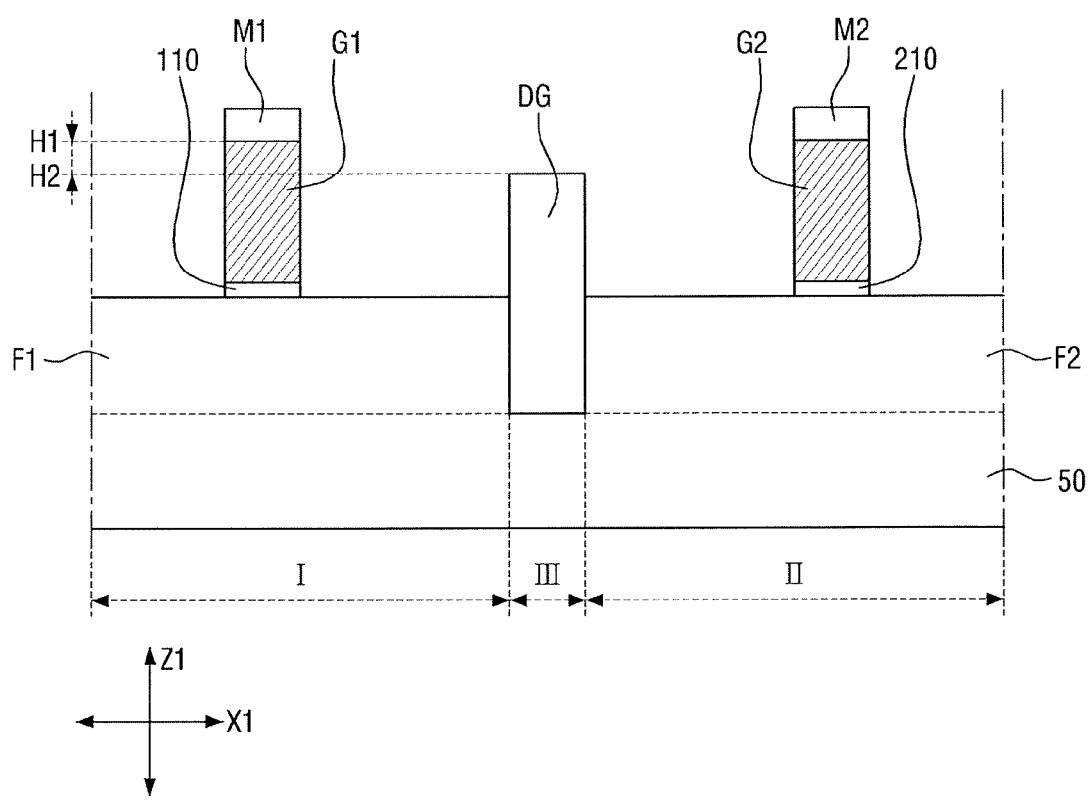

Referring to FIGS. 15 and 16, the dummy spacers 400 are removed. In order to protect the first and second gate electrodes G1 and G2 and the first and second gate insulating films 110 and 210, the first and second pattern films M1 and M2 and the dummy spacers 400 may have etching selectivity. That is, in an etching process of removing the dummy spacers 400, the first and second pattern films M1 and M2 may serve as masks.

Accordingly, while the first dummy spacer 410 and the second dummy spacer 420 are etched, the first and second pattern films M1 and M2 prevent the first and second gate electrodes G1 and G2 and the first and second gate insulating films 110 and 210 from being etched.

Referring to FIGS. 1 to 3, the first pattern film M1 formed on the first gate electrode G1 is removed. Correspondingly, the second pattern film M2 formed on the second gate electrode G2 is also removed.

Then, the first spacer 120 is formed on the side surfaces of the first gate electrode G1 and the first gate insulating film 110. Similarly, the second spacer 220 is formed on the side surfaces of the second gate electrode G2 and the second gate insulating film 210. In addition, the third spacer 320 is formed on the side surfaces of the dummy gate DG.

Since the height of the upper surface of the dummy gate DG is lower than the height of the upper surfaces of the first gate electrode G1 and the second gate electrode G2, the height of the third spacer 320 is lower than the height of the first and second spacers 120 and 220.

The second source/drain regions 230 and 240 are formed on the side surfaces of the first gate electrode G1 and the second gate electrode G2. The second source/drain regions 230 and 240 may be formed by forming recesses in the side surfaces of the first and second gate electrodes G1 and G2 and filling the recesses. The recesses may be curved. For example, the second source/drain regions 230 and 240 may have an elevated source/drain. In an example embodiment, the upper surfaces of the second source/drain regions 230 and 240 are located on the same plane. That is, the second source/drain regions 230 and 240 may be grown and formed during the same process time.

In the method for fabricating the semiconductor device 1 according to the embodiment of the present inventive concept, since the cutting of the fins is performed by an etch-back process using self-alignment unlike the single diffusion break, high reliability can be achieved in semiconductor devices with a very small size.

Further, the dummy gate should be formed on the cut portion of the fins in the single diffusion break process. However, in the method for fabricating the semiconductor device 1 according to the embodiment of the present inventive concept, by forming the dummy gate DG made of an insulator rather than a conductor between the cut fins rather than the cut portion of the fins, it is possible to reduce the difficulty of the process and increase the yield.

Hereinafter, a semiconductor device 2 according to an example embodiment of the present inventive concept will be described with reference to FIGS. 17 and 18. The components of semiconductor device 2 that are the same as components of the semiconductor device 1 are denoted by the same reference numerals, and a redundant description will be omitted or simplified.

Figure 17:
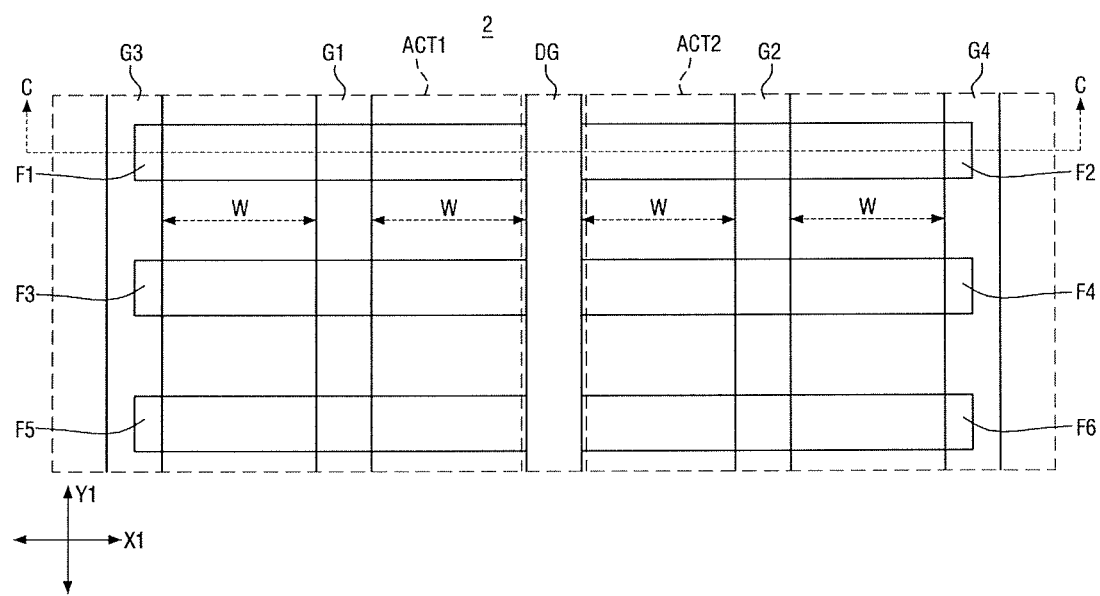
FIG. 17 is a layout diagram for explaining a semiconductor device according to an example embodiment of the inventive concept.

FIG. 17 is a layout diagram for explaining a semiconductor device according to an example embodiment of the present inventive concept. FIG. 18 is a cross-sectional view taken along line C-C of FIG. 17.

Figure 18:
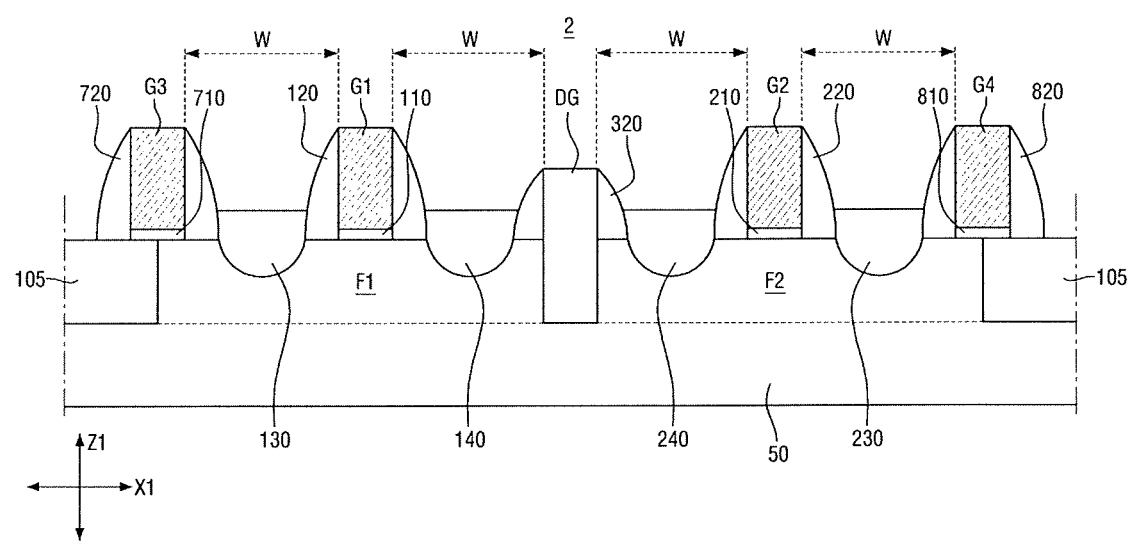
FIG. 18 is a cross-sectional view taken along line C-C of FIG. 17.

Referring to FIGS. 17 and 18, the semiconductor device 2 according to the embodiment of the present inventive concept includes a third gate electrode G3 and a fourth gate electrode G4.

The third gate electrode G3 may be arranged in parallel with the first gate electrode G1, the second gate electrode G2 and the dummy gate DG. The third gate electrode G3 may extend in the second direction Y1. The third gate electrode G3 is spaced apart from the first gate electrode G1 in the first direction X1. The third gate electrode G3 is adjacent to the first gate electrode G1. That is, the first gate electrode G1 is located between the dummy gate DG and the third gate electrode G3.

The fourth gate electrode G4 may be arranged in parallel with the first gate electrode G1, the second gate electrode G2, the third gate electrode G3 and the dummy gate DG. The fourth gate electrode G4 may extend in the second direction Y1. The fourth gate electrode G4 is spaced apart from the second gate electrode G2 in the first direction X1. The fourth gate electrode G4 is adjacent to the second gate electrode G2. That is, the second gate electrode G2 is located between the dummy gate DG and the fourth gate electrode G4.

The third gate electrode G3 may overlap with the end of the first active fin F1. That is, as illustrated, one end of the first active fin F1 is in contact with the dummy gate DG, and the other end of the first active fin F1 overlaps with the third gate electrode G3. The other end of the first active fin F1 may contact a third insulating film 710 in which the third gate electrode is disposed on. The third gate electrode G3 may also overlap with the other end of the third active fin F3 and the other end of the fifth active fin F5.

The fourth gate electrode G4 may overlap with the end of the second active fin F2. That is, as illustrated, one end of the second active fin F2 is in contact with the dummy gate DG, and the other end of the second active fin F2 overlaps with the fourth gate electrode G4. The fourth gate electrode G4 may also overlap with the other end of the fourth active fin F4 and the other end of the sixth active fin F6.

In an example embodiment, the distance w between the third gate electrode G3 and the first gate electrode G1 are the same as the distance w between the first gate electrode G1 and the dummy gate DG. Similarly, in an example embodiment, the distance w between the fourth gate electrode G4 and the second gate electrode G2 are also the same as the distance w between the second gate electrode G2 and the dummy gate DG. That is, all the first to fourth gate electrodes G1 to G4 and the dummy gate DG may be equally spaced apart from one another.

The third gate electrode G3 and the fourth gate electrode G4 overlap with the field insulating film 105. The field insulating layer 105 may contact the third insulating layer 710 in which the third gate electrode G3 is disposed on and contact a fourth insulating layer 810 in which the fourth gate electrode G4 is disposed on. The third gate insulating film 710 is formed between the first active fin F1 and the field insulating film 105 and the third gate electrode G3. A fourth spacer 720 is formed on the side surfaces of the third gate electrode G3 and the third gate insulating film 710. Similarly, the fourth gate insulating film 810 is formed between the second active fin F2 and the field insulating film 105 and the fourth gate electrode G4. A fifth spacer 820 is formed on the side surfaces of the fourth gate electrode G4 and the fourth gate insulating film 810.

In an example embodiment, the third gate electrode G3 and the third gate insulating film 710 is a dummy gate structure which does not operate as an actual gate structure. Similarly, the fourth gate electrode G4 and the fourth gate insulating film 810 are a dummy gate structure which does not operate as an actual gate structure. That is, the semiconductor device 2 according to the embodiment of the present inventive concept constitutes a double diffusion break at the other end of each of the first and second active fins F1 and F2. That is, the semiconductor device 2 comprises a structure including a new active fin which is spaced apart from the other end of the first and second active fins F1 and F2 by a gate pitch.

Hereinafter, a semiconductor device 3 according to an example embodiment of the present inventive concept will be described with reference to FIG. 19. The components of semiconductor device 3 that are the same as components of the semiconductor devices 1 and 2 are denoted by the same reference numerals, and a redundant description will be omitted or simplified.

Figure 19:
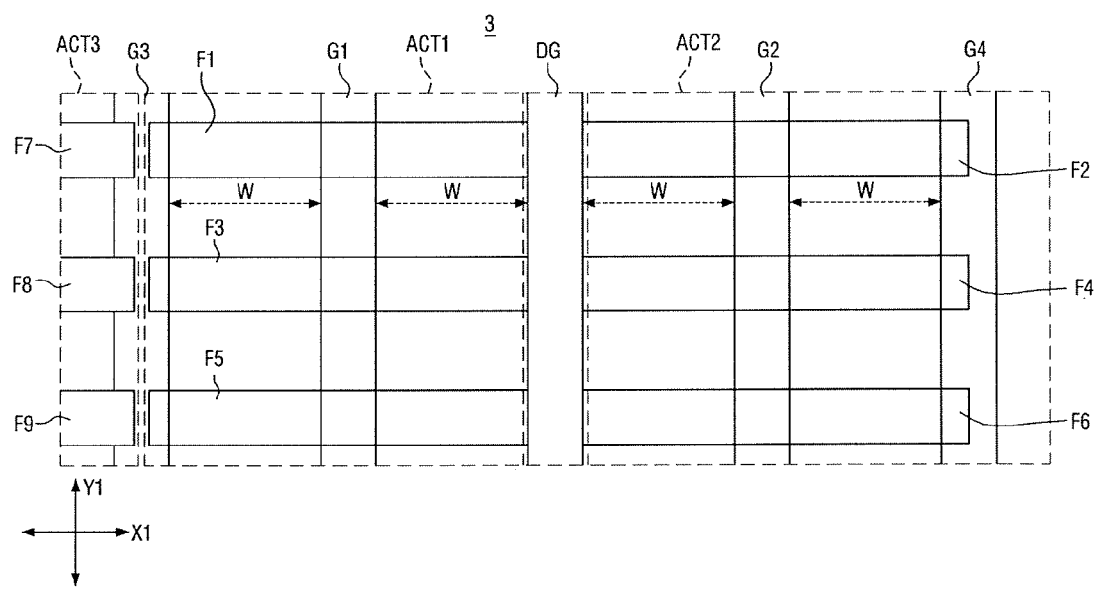
FIG. 19 is a cross-sectional view illustrating a semiconductor device according to an example embodiment of the inventive concept.

Referring to FIG. 19, a semiconductor device 3 according to an example embodiment of the present inventive concept further comprises seventh to ninth active fins F7 to F9.

The seventh active fin F7 may extend in the first direction. The seventh active fin F7 may be arranged separately from the first active fin F1 in the first direction X1. For example, space may be present between the first active fin F1 and the seventh active fin F7. The eighth active fin F8 may extend in the first direction X1. The eighth active fin F8 may be arranged separately from the fourth active fin F4 in the first direction X1. For example, space may be present between the fourth active fin F4 and the eighth active fin F8. The ninth active fin F9 may extend in the first direction X1. The ninth active fin F9 may be arranged separately from the sixth active fin F6 in the first direction X1. For example, space may be present between the sixth active fin F6 and the ninth active fin F9.

The seventh to ninth active fins F7 to F9 may be arranged side by side to be spaced apart from each other in the second direction. The field insulating film 105 may be formed between the seventh to ninth active fins F7 to F9.

The third gate electrode G3 may overlap with the end of each of the seventh to ninth active fins F7 to F9. That is, as illustrated, one end of each of the first, third and fifth active fins F1, F3 and F5 is in contact with the dummy gate DG, and the other end thereof is arranged to face one end of each of the seventh to ninth active fins F7 to F9. That is, the semiconductor device 3 according to the embodiment of the present inventive concept also constitutes a single diffusion break at the other end of each of the first, third and fifth active fins F1, F3 and F5. In this embodiment, the first, third and fifth active fins F1, F3 and F5 are spaced apart from the second, fourth and sixth active fins F2, F4 and F6 by the width of the dummy gate DG, and are spaced apart from the seventh to ninth active fins F7 to F9 by a distance smaller than the width of the third region III. Thus, it is possible to improve the integration and performance of semiconductor devices.

Hereinafter, a semiconductor device 4 according to an example embodiment of the present inventive concept will be described with reference to FIG. 20. The components of the semiconductor device 4 that are the same as components of the semiconductor device 1 are denoted by the same reference numerals, and a redundant description will be omitted or simplified.

Figure 20:
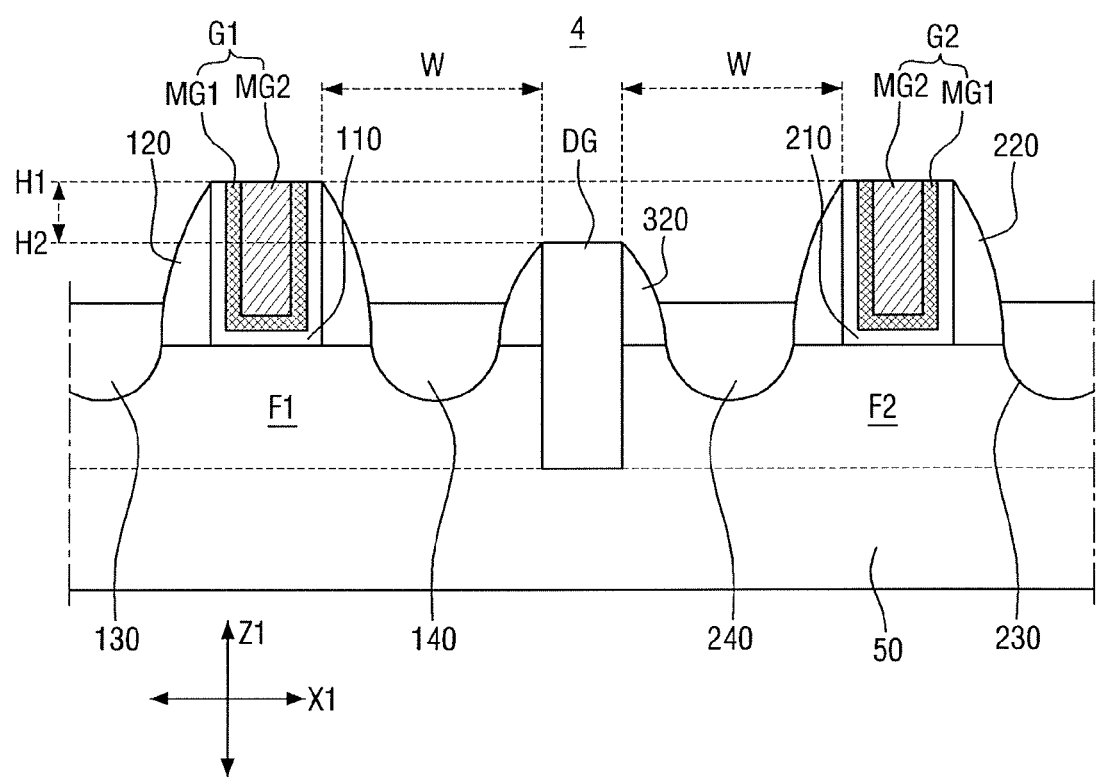
FIG. 20 is a cross-sectional view illustrating a semiconductor device according to an example embodiment of the present inventive concept.

FIG. 20 is a cross-sectional view illustrating a semiconductor device according to an example embodiment of the present inventive concept.

Referring to FIG. 20, in the semiconductor device 4 according to the embodiment of the present inventive concept, the first and second gate electrodes G1 and G2 include two or more metal layers MG1 and MG2. As illustrated, the first and second gate electrodes G1 and G2 are formed by stacking two or more metal layers MG1 and MG2. The first metal layer MG1 may serve to adjust a work function, and the second metal layer MG2 may serve to fill a space formed by the first metal layer MG1. For example, the first metal layer MG1 may include at least one of TiN, TaN, TiC, and TaC. Further, the second metal layer MG2 may include W or Al. The first and second gate electrodes G1 and G2 may be formed through, for example, a replacement process (or gate last process), but the present inventive concept is not limited thereto.

Hereinafter, a method for fabricating the semiconductor device according to the embodiment of the present inventive concept will be described with reference to FIGS. 2, 4 to 16 and 20.

Since FIGS. 4 to 18 show the same steps as the method for fabricating the semiconductor device 1, a description of substantially the same contents will be omitted, and the steps of FIGS. 2 and 20 will be described.

Referring to FIGS. 2 and 20, the first and second gate electrodes G1 and G2 of FIG. 2 are removed, and the first and second gate insulating films 110 and 210 of FIG. 2 are removed. Then, by stacking the first and second gate insulating films 110 and 210 (see FIG. 20) and the two or more metal layers MG1 and MG2 at the places where the first and second gate electrodes G1 and G2 (see FIG. 2) and the first and second gate insulating films 110 and 210 (see FIG. 2) are removed, it is possible to complete the semiconductor device 4 according to the embodiment of the present inventive concept.

Next, an electronic system including a semiconductor device according to an example embodiment of the present inventive concept will be described with reference to FIG. 21.

Figure 21:
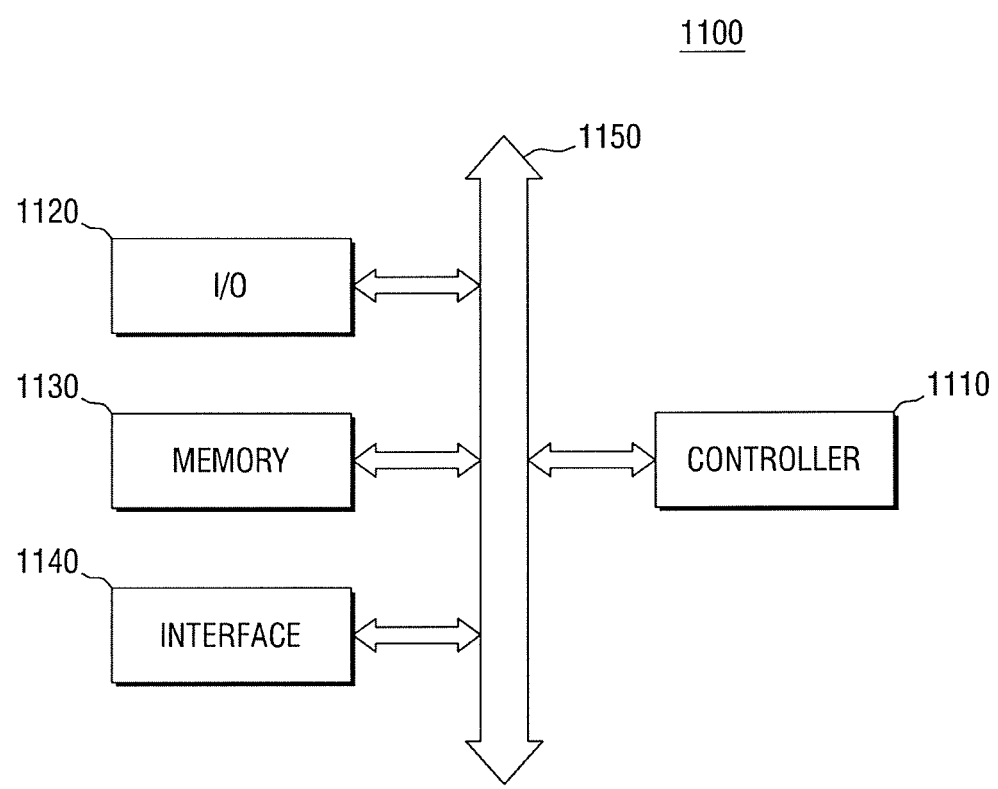
FIG. 21 is a block diagram of an electronic system including a semiconductor device according to an example embodiment of the inventive concept.

FIG. 21 is a block diagram of an electronic system including a semiconductor device according to an example embodiment of the present inventive concept.

Referring to FIG. 21, an electronic system 1100 according to the embodiment of the present inventive concept includes a controller 1110, an input/output (I/O) device 1120, a memory device 1130, an interface 1140, and a bus 1150. The controller 1110, the I/O device 1120, the memory device 1130, and/or the interface 1140 are coupled to each other through the bus 1150. The bus 1150 corresponds to a path through which data is transferred.

The controller 1110 may include at least one of a microprocessor, a digital signal processor, a micro-controller and other logic devices capable of performing functions similar to those thereof. The I/O device 1120 may include a keypad, a keyboard and a display device and the like. The memory device 1130 may store data and/or commands. The interface 1140 serves to transmit/receive data to/from a communication network. The interface 1140 may be of a wired or wireless type. For example, the interface 1140 may include an antenna or a wired/wireless transceiver or the like. Although not shown, the electronic system 1100 may further include a high-speed dynamic random access memory DRAM and/or a static random access memory SRAM as an operating memory for improving the operation of the controller 1110.

The semiconductor devices 1, 2, 3, and 4 according to the embodiments of the present inventive concept may be located in the memory device 1130, or may be provided as part of the controller 1110 and the I/O device 1120. In an example embodiment, at least one of the semiconductor devices 1, 2, 3, and 4 forms a multi-gate transistor.

The electronic system 1100 may be applied to a personal digital assistant (PDA), a portable computer, a web tablet, a wireless phone, a mobile phone, a digital music player, a memory card, or any electronic product capable of transmitting and/or receiving information in a wireless environment.

Figure 22:
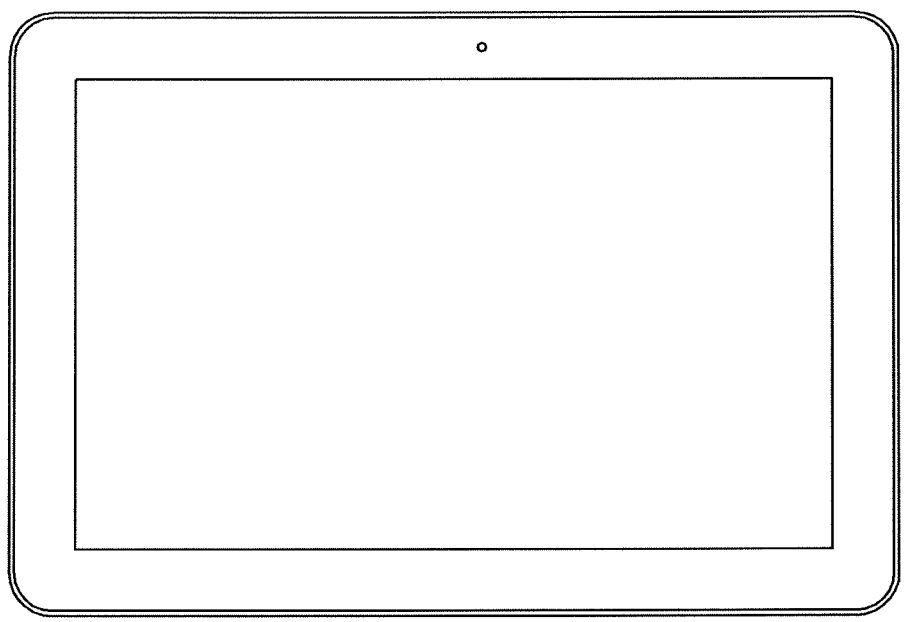
FIGS. 22 and 23 show exemplary semiconductor systems to which the semiconductor device may be applied according to embodiments of the inventive concept.
Figure 23:
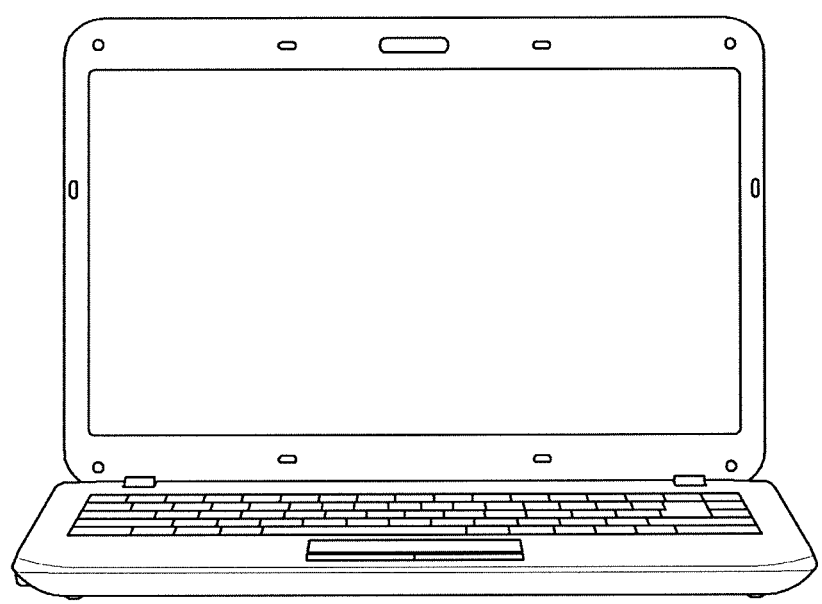

FIGS. 22 and 23 show exemplary semiconductor systems to which the semiconductor device according to some embodiments of the present inventive concept is applicable. FIG. 22 shows a tablet PC, and FIG. 23 shows a laptop. At least one of the semiconductor devices 1, 2, 3, and 4 according to the embodiments of the present inventive concept may be used in a tablet PC, laptop, or the like. It is apparent to those skilled in the art that the semiconductor device according to some embodiments of the present inventive concept can be applied to other integrated circuit devices which are not illustrated.

While the present inventive concept has been particularly shown and described with reference to example embodiments thereof, it will be understood by those of ordinary skill in the art that various changes in form and details may be made therein without departing from the spirit and scope of the disclosure.

What is claimed is:
1. A method for fabricating a semiconductor device, comprising;

forming a pre-fin extending in a first direction, the pre-fin including a first region, a second region and a third region separating the first region from the second region;
forming first and second gates on the pre-fin to extend in a second direction intersecting the first direction, the first and second gates being spaced apart from each other in the first direction and overlapping with the first and second regions, respectively;
forming first and second dummy spacers on the first and second regions, respectively, to form a first trench in the third region that exposes the third region;
forming a second trench by etching the exposed third region using the first and second dummy spacers as masks to separate the pre-fin into first and second active fins corresponding to the first and second regions, respectively;
forming a dummy gate by filling the first and second trenches; and
removing the first and second dummy spacers after the dummy gate has been formed.

2. The method of claim 1, further comprising forming first and second spacers on side surfaces of the first and second gates, respectively, and forming a third spacer on side surfaces of the dummy gate.

3. The method of claim 1, further comprising, after forming the pre-fin, forming a field insulating film to surround the pre-fin,
wherein an upper surface of the field insulating film is lower than an upper surface of the dummy gate.

4. The method of claim 1, wherein the forming the first and second gates comprises:
forming a gate layer;
forming a pattern film on the gate layer; and
patterning the gate layer using the pattern film as a mask.

5. The method of claim 4, wherein the removing the first and second dummy spacers comprises using wet etching.

6. The method of claim 4, wherein the pattern film and the first and second dummy spacers have etching selectivity, and
Wherein the removing the first and second dummy spacers comprises removing the first and second dummy spacers using the pattern film as a mask.

7. The method of claim 1, wherein the forming the first and second gates further comprises forming a third gate on the first active fin to extend in the second direction and to be spaced apart from the first gate in the first direction, and a fourth gate on the second active fin to extend in the second direction and to be spaced apart from the second gate in the first direction, and
wherein the first and second gates are located between the third and fourth gates.

8. The method of claim 7, further comprising, after forming the pre-fin, forming a field insulating film to surround the pre-fin,
wherein a portion of a width of the third gate in the first direction overlaps with the first active fin, and the other portion of the width of the third gate in the first direction overlaps with the field insulation film.

9. The method of claim 1, wherein the dummy gate includes at least one of an oxide film and a nitride film.

10. The method of claim 1, further comprising forming a first elevated source/drain on side surfaces of the first gate and a second elevated source/drain on side surfaces of the second gate,
wherein an upper surface of the first elevated source/drain is located on the same plane with an upper surface of the second elevated source/drain.

11. The method of claim 1, wherein a width of the first and second gates in the first direction is the same as a width of the third region in the first direction.

12. A method for fabricating a semiconductor device, comprising:
forming a pre-fin;
forming first and second gates intersecting the pre-fin and extending in parallel with each other;
forming a dummy spacer including a first trench to expose the pre-fin between the first and second gates, the dummy spacer covering the pre-fin;
dividing the pre-fin into first and second active fins by extending the first trench to a second trench;
forming a dummy gate including an insulating material in the second trench; and
removing the dummy spacer after the dummy gate has been formed.

13. The method of claim 12, wherein an upper surface of the dummy gate is lower than upper surfaces of the first and second gates.

14. The method of claim 12, wherein the extending the first trench to the second trench comprises etching a portion of the pre-fin using the dummy spacer as a mask such that the second trench is aligned with the first trench.

15. The method of claim 12, wherein a height of the dummy gate is the same as or lower than the first and second gates.

16. A method for fabricating a semiconductor device, comprising:
performing a process on a semiconductor material to generate a semiconductor layer comprising first, second, and third regions, the third region disposed between the first and second regions;
forming a first gate on the first region and a second gate on the second region;
forming a first spacer on the first region and a second spacer on the second region;
forming a trench by etching the third region using the first and second spacers as masks to separate the semiconductor layer into first and second fins;
filling the trench with a first insulating layer such that the first and second spacers remain partially exposed;
removing the first and second spacers;
forming a third gate on the first fin to be spaced apart from the first gate and a fourth gate on the second fin spaced apart from the second gate, wherein the first and second gates are located between the third and fourth gates; and
forming a second insulating layer to surround the semiconductor layer, wherein the third gate overlaps the first fin and a region of the second insulating layer.

17. The method of claim 16, wherein the process generates the semiconductor layer by growing an epitaxial layer from the semiconductor material.

18. The method of claim 16, further comprising forming a third fin in parallel to and separated from the first fin, wherein the third gate overlaps the third fin.

* * * * *